United States Patent
Shenoy

(10) Patent No.: US 9,045,332 B2
(45) Date of Patent: Jun. 2, 2015

(54) THIN BACK GLASS INTERCONNECT

(75) Inventor: Ravindra V. Shenoy, Dublin, CA (US)

(73) Assignee: Qualcomm MEMS Technologies, Inc., San Diego, CA (US)

( * ) Notice: Subject to any disclaimer, the term of this patent is extended or adjusted under 35 U.S.C. 154(b) by 478 days.

(21) Appl. No.: 13/306,284

(22) Filed: Nov. 29, 2011

(65) Prior Publication Data

US 2013/0135317 A1 May 30, 2013

(51) Int. Cl.
*A61F 13/00* (2006.01)
*B81C 1/00* (2006.01)

(52) U.S. Cl.
CPC ......... *B81C 1/00047* (2013.01); *B81C 1/00301* (2013.01); *B81B 2203/0315* (2013.01); *B81B 2207/092* (2013.01); *B81B 2207/095* (2013.01); *B81C 2203/0127* (2013.01)

(58) Field of Classification Search
CPC ............ A61B 5/14532; A61B 5/6821; A61B 5/1486; A61B 5/14507; A61B 5/0002; A61B 5/0004; A61B 5/1455; A61B 5/1473; A61B 5/14865; A61B 5/6867; A61B 2560/0214; A61B 5/0026; A61B 5/1495
USPC ................... 602/41–54, 4; 361/752; 257/678
See application file for complete search history.

(56) References Cited

U.S. PATENT DOCUMENTS

| | | | |
|---|---|---|---|
| 6,030,829 A | 2/2000 | Dannoux et al. | |
| 6,303,462 B1 | 10/2001 | Gidon | |
| 6,528,344 B2 | 3/2003 | Kang | |
| 7,259,080 B2 | 8/2007 | Quenzer et al. | |
| 7,352,039 B2 | 4/2008 | Garcia | |
| 7,416,961 B2 | 8/2008 | Quenzer et al. | |
| 2005/0205951 A1 | 9/2005 | Eskridge | |
| 2008/0029863 A1* | 2/2008 | Eskridge et al. | 257/678 |
| 2009/0213450 A1 | 8/2009 | Sampsell | |
| 2010/0290199 A1* | 11/2010 | Schmid et al. | 361/752 |

FOREIGN PATENT DOCUMENTS

| | | |
|---|---|---|
| TW | I231980 | 5/2005 |
| TW | 200736783 | 10/2007 |
| TW | 200950040 A | 12/2009 |

OTHER PUBLICATIONS

Esashi M ED—The Japan Society of Applied Phyics/Institute of Electrical and Electronics Engineers: "MEMS Technology: Optical Application, Medical Application and SOC Application," 2002 Symposium on VLSI Technology, Digest of Technical Papers, Honolulu, Jun. 11-13, 2002 [Symposium on VLSI Technology], New York, NY: IEEE, US, Jun. 11, 2012, pp. 6-9, XP001109801, DOI: 10.1109/VLSIT.2002.1015366, ISBN:978-0-7803-7312-9.

(Continued)

*Primary Examiner* — Michael Brown
(74) *Attorney, Agent, or Firm* — Weaver Austin Villeneuve & Sampson LLP

(57) ABSTRACT

This disclosure provides systems, methods and apparatus for providing packaged microelectromechanical systems (MEMS) devices. In one aspect, package can include a cover glass joined to a device substrate, the cover glass including integrated electrical connectivity and configured to encapsulate one or more MEMS devices on the device substrate. The cover glass can include one or more spin-on glass layers and electrically conductive routing and interconnects. The package can include a narrow seal surrounding the one or more encapsulated MEMS devices.

17 Claims, 20 Drawing Sheets

(56) References Cited

OTHER PUBLICATIONS

International Search Report and Written Opinion—PCT/US2012/067120—ISA/EPO—Apr. 9, 2013.
RF MEMS Packaging. http://www.memtronics.com/page.aspx?page_id=36, accessed Nov. 19, 2010, 3 pages.
Taiwan Search Report—TW101144591—TIPO—Aug. 5, 2014.
Written Opinion of the International Preliminary Examining Authority—PCT/US12/67120—Feb. 13, 2014.
Notification of Transmittal of the International Preliminary Report on Patentability—PCT/US12/67120—May 2, 2014.

* cited by examiner

| | Common Voltages | | | | |
|---|---|---|---|---|---|
| Segment Voltages | $VC_{ADD\_H}$ | $VC_{HOLD\_H}$ | $VC_{REL}$ | $VC_{HOLD\_L}$ | $VC_{ADD\_L}$ |
| $VS_H$ | Stable | Stable | Relax | Stable | Actuate |
| $VS_L$ | Actuate | Stable | Relax | Stable | Stable |

THIN BACK GLASS INTERCONNECT

TECHNICAL FIELD

This disclosure relates to structures and processes for encapsulating electromechanical systems devices on substrates.

DESCRIPTION OF THE RELATED TECHNOLOGY

Electromechanical systems (EMS) include devices having electrical and mechanical elements, actuators, transducers, sensors, optical components (such as mirrors and optical film layers) and electronics. Electromechanical systems can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of electromechanical systems device is called an interferometric modulator (IMOD). As used herein, the term interferometric modulator or interferometric light modulator refers to a device that selectively absorbs and/or reflects light using the principles of optical interference. In some implementations, an interferometric modulator may include a pair of conductive plates, one or both of which may be transparent and/or reflective, wholly or in part, and capable of relative motion upon application of an appropriate electrical signal. In an implementation, one plate may include a stationary layer deposited on a substrate and the other plate may include a reflective membrane separated from the stationary layer by an air gap. The position of one plate in relation to another can change the optical interference of light incident on the interferometric modulator. Interferometric modulator devices have a wide range of applications, and are anticipated to be used in improving existing products and creating new products, especially those with display capabilities.

MEMS packaging protects the functional units of the system from the environment, provides mechanical support for the system components, and provides an interface for electrical interconnections.

SUMMARY

The systems, methods and devices of the disclosure each have several innovative aspects, no single one of which is solely responsible for the desirable attributes disclosed herein.

One innovative aspect of the subject matter described in this disclosure can be implemented in a package including a cover glass joined to a device substrate. The cover glass can include integrated electrical connectivity and be configured to encapsulate one or more MEMS devices on the device substrate. In some implementations, the cover glass can include one or more spin-on glass layers and electrically conductive routing and interconnects. The package can include a narrow seal surrounding the one or more encapsulated MEMS devices.

Another innovative aspect of the subject matter described in this disclosure can be implemented in an apparatus including a cover glass having first and second opposing sides. The cover glass can include one or more spin-on glass layers, a cavity and a joining ring surrounding the cavity. One or more routing lines can be on the first side, with one or more posts extending through the one or more spin-on-glass layers to electrically connect the one or more routing lines on the first side to the second side.

The one or more routing lines can conformally extend along at least a portion of the cavity. In some implementations, the cover glass can be about 30 and 150 microns thick. In some implementations, the joining ring can be between about 100 and 500 microns wide. In some implementations, the one or more routing lines can include a nickel-based material. The apparatus can further include a device substrate including one or more devices disposed on a surface of the device substrate. The cover glass can be joined to the surface of the device substrate. The one or more devices can be in electrical communication with the one or more posts.

Another innovative aspect of the subject matter described in this disclosure can be implemented in an apparatus including a device substrate, a device mounted on the device substrate, means for encapsulating the device, and means for electrically connecting the encapsulated device. In some implementations, the means for encapsulating the device can include a cover glass formed of a solidified liquid dielectric material. In some implementations, the means for electrically connecting the encapsulated device can include pillars embedded in and extending through the cover glass.

Yet another innovative aspect of the subject matter described in this disclosure can be implemented in a method of forming a cover. The method can include forming a sacrificial layer on a sacrificial substrate, with the sacrificial layer including a raised feature on a substantially planar surface, and forming a joining ring and one or more routing lines on the sacrificial layer. The method can include forming one or more posts connected to the one or more routing lines and oriented substantially perpendicularly to the first substrate. The method can include depositing and curing one or more spin-on dielectric layers to cover the sacrificial layer, joining ring, one or more routing lines and one or more posts. The method can include planarizing the one or more spin-on dielectric layers to expose the one or more posts and to form a cover releasably attached to the first substrate via the sacrificial layer. The cover can include first and second opposing sides, the first side including the one or more routing lines, the joining ring and a cavity, and the one or more posts extending through the one or more planarized spin-on dielectric layers to electrically connect the one or more routing lines to the second side.

In some implementations, the method can further include releasably attaching a carrier substrate to the cover, and etching the sacrificial layer to release the sacrificial substrate from the cover and thereby void the cavity. In some implementations, the method can include joining the cover to a substrate having one or more devices disposed thereon, such that the cover covers the one or more devices.

In some implementations, the method can include joining a cover that includes a plurality of arrayed cavities and associated joining rings, routing lines and interconnects, to a substrate having a plurality of arrayed devices disposed thereon, such that each of the plurality of arrayed devices is disposed in one of the plurality of arrayed cavities. The method can further include singulating the joined cover and substrate.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
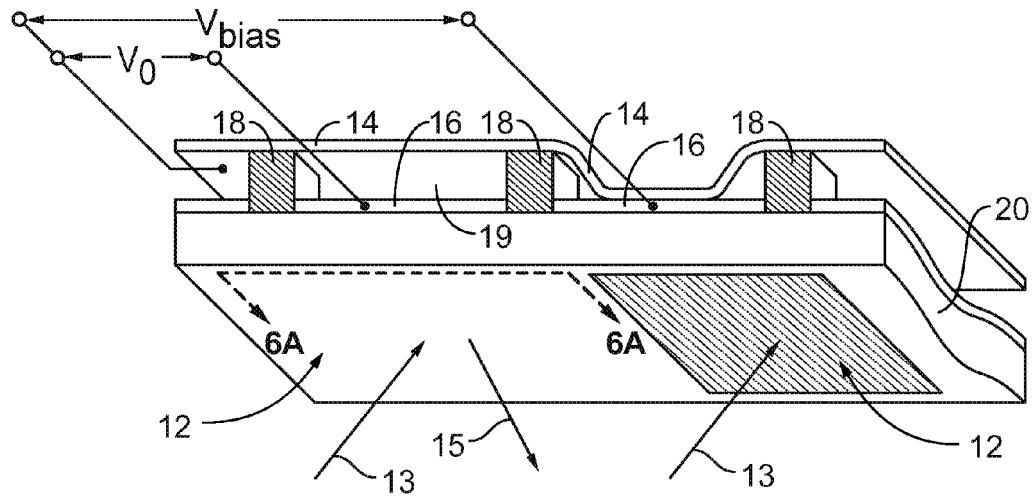
FIG. 1 shows an example of an isometric view depicting two adjacent pixels in a series of pixels of an interferometric modulator (IMOD) display device.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device or system that can be configured to display an image, whether in motion (e.g., video) or stationary (e.g., still image), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, GPS receivers/navigators, cameras, MP3 players, camcorders, game consoles, wrist watches, clocks, calculators, television monitors, flat panel displays, electronic reading devices (i.e., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS), microelectromechanical systems (MEMS) and non-MEMS applications), aesthetic structures (e.g., display of images on a piece of jewelry) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Some implementations described herein relate to packaging of MEMS devices. Packages to encapsulate such devices and related fabricated methods are described herein. While implementations of the methods of encapsulation and the resulting encapsulated devices are described chiefly in the context of packaging of MEMS devices and other electromechanical systems devices, the methods and packages are not so limited and may be implemented for packaging of other types of devices or structures. Furthermore, "MEMS devices" may refer to devices generally of various scales, including micrometer and nanometer scale devices, as well as devices having dimensions one or more orders of magnitude greater than micrometers.

Encapsulation techniques can include thin-film encapsulation and macro-level encapsulation. A thin-film encapsulation process can involve depositing one or more thin film layers over the MEMS device, while a macro-level encapsulation can involve bonding or otherwise joining a cover to a device provided on a substrate to form a package.

In some implementations, macro-level methods of encapsulating MEMS devices are described. Encapsulation of MEMS devices can provide a controlled atmosphere for operation of the devices. In some implementations, the methods are batch encapsulation processes performed prior to die singulation. Batch level encapsulation of MEMS devices refers to encapsulating a plurality of MEMS devices simultaneously and can be performed at a panel, wafer, substrate, sub-panel, sub-wafer, or sub-substrate level. Certain operations in a batch level encapsulation process are performed once for a plurality of devices, rather than performed separately for each device. In some implementations, the batch level processes involve encapsulating a plurality of devices that have been fabricated on a wafer, panel or other substrate prior to singulation of the wafer, panel or other substrate into individual dies.

In some implementations, devices are encapsulated on a substrate, such as a glass, plastic or silicon substrate. A package including the substrate and encapsulated device(s) can be thin, having a thickness of about 30-150 microns beyond the thickness of the substrate. The total overall thickness for a packaged MEMS device fabricated on a 500 micron substrate may be about 530-650 microns, for example. In some implementations, a package includes a narrow seal surrounding an encapsulated device. The seal can be less than about 1 millimeter wide, for example, and in some implementations less than 200 microns wide. The encapsulation methods described herein can be used to encapsulate devices of arbitrary thickness and area. For example, in some implementations, devices having thicknesses of about 1-30 microns or greater can be encapsulated. Also, in some implementations, devices having areas of 1 square micron to tens of square millimeters can be encapsulated.

In some implementations, the batch-level methods involve providing a cover plate and a device substrate, the device substrate including a plurality of devices and the cover plate including a cover glass including integrated electrical connectivity configured to encapsulate at least some of the plurality of devices. The cover plate can include a carrier substrate to which the cover glass is attached. The cover glass can be joined to the device substrate to encapsulate the plurality of devices, and then released from the carrier substrate.

In some implementations, methods of fabricating cover glasses are described. The methods can involve fabricating non-glass components of a cover glass on a sacrificial substrate, and then depositing and curing one or more spin-on glass layers on the sacrificial substrate. The sacrificial substrate can then be released allowing the cover glass to be joined to a device substrate. Non-glass components of the cover glass can include one or more of electrically conductive routing, electrically conductive interconnects, and components to facilitate joining to the device substrate.

Particular implementations of the subject matter described in this disclosure can be implemented to realize one or more of the following potential advantages. In some implementations, batch panel-level processing methods can be used to eliminate or reduce die-level processing. Advantages of encapsulation and packaging in a batch process at a panel, or a sub-panel, level include a large number of units fabricated in parallel in the batch process, thus reducing costs per unit as compared to individual die level processing. The use of batch processes such as lithography, etching and plating over a large substrate in some implementations allows tighter tolerances and reduces die-to-die variation. Batch processes can be used to fabricate cover glasses for multiple dies simultaneously. In some implementations, the encapsulation methods can be used to fabricate thin packaged devices. In some implementations, the encapsulated MEMS devices include a narrow seal ring. Narrow seal rings can reduce die size. In some implementations, the encapsulation methods can enable setting a desired atmosphere for the encapsulated MEMS devices. In some implementations, the encapsulation methods can be used to form cavities that will accommodate MEMS devices, with formation of the cavities occurring away from the MEMS devices. This can reduce exposure of the MEMS devices to etching and other processing compared to thin film or other encapsulation techniques in which cavities are formed on the same substrate as the MEMS devices. In some implementations, the methods can be used to fabricate electrical routing in a three dimensional structure that enables redistribution from one plane to another and from one type of electrical pads, such as peripheral pads, to another type of electrical pads, such as area array pads.

An example of a suitable MEMS device, to which the described implementations may apply, is a reflective display device. Reflective display devices can incorporate interferometric modulators (IMODs) to selectively absorb and/or reflect light incident thereon using principles of optical interference. IMODs can include an absorber, a reflector that is movable with respect to the absorber, and an optical resonant cavity defined between the absorber and the reflector. The reflector can be moved to two or more different positions, which can change the size of the optical resonant cavity and thereby affect the reflectance of the interferometric modulator. The reflectance spectrums of IMODs can create fairly broad spectral bands which can be shifted across the visible wavelengths to generate different colors. The position of the spectral band can be adjusted by changing the thickness of the optical resonant cavity. One way of changing the optical resonant cavity is by changing the position of the reflector.

FIG. 1 shows an example of an isometric view depicting two adjacent pixels in a series of pixels of an interferometric modulator (IMOD) display device. The IMOD display device includes one or more interferometric MEMS display elements. In these devices, the pixels of the MEMS display elements can be in either a bright or dark state. In the bright ("relaxed," "open" or "on") state, the display element reflects a large portion of incident visible light, e.g., to a user. Conversely, in the dark ("actuated," "closed" or "off") state, the display element reflects little incident visible light. In some implementations, the light reflectance properties of the on and off states may be reversed. MEMS pixels can be configured to reflect predominantly at particular wavelengths allowing for a color display in addition to black and white.

The IMOD display device can include a row/column array of IMODs. Each IMOD can include a pair of reflective layers, i.e., a movable reflective layer and a fixed partially reflective layer, positioned at a variable and controllable distance from each other to form an air gap (also referred to as an optical gap or cavity). The movable reflective layer may be moved between at least two positions. In a first position, i.e., a relaxed position, the movable reflective layer can be positioned at a relatively large distance from the fixed partially reflective layer. In a second position, i.e., an actuated position, the movable reflective layer can be positioned more closely to the partially reflective layer. Incident light that reflects from the two layers can interfere constructively or destructively depending on the position of the movable reflective layer, producing either an overall reflective or non-reflective state for each pixel. In some implementations, the IMOD may be in a reflective state when unactuated, reflecting light within the visible spectrum, and may be in a dark state when unactuated, absorbing and/or destructively interfering light within the visible range. In some other implementations, however, an IMOD may be in a dark state when unactuated, and in a reflective state when actuated. In some implementations, the introduction of an applied voltage can drive the pixels to change states. In some other implementations, an applied charge can drive the pixels to change states.

The depicted portion of the pixel array in FIG. 1 includes two adjacent interferometric modulators 12. In the IMOD 12 on the left (as illustrated), a movable reflective layer 14 is illustrated in a relaxed position at a predetermined distance from an optical stack 16, which includes a partially reflective layer. The voltage $V_0$ applied across the IMOD 12 on the left is insufficient to cause actuation of the movable reflective layer 14. In the IMOD 12 on the right, the movable reflective layer 14 is illustrated in an actuated position near or adjacent the optical stack 16. The voltage $V_{bias}$ applied across the IMOD 12 on the right is sufficient to maintain the movable reflective layer 14 in the actuated position.

In FIG. 1, the reflective properties of pixels 12 are generally illustrated with arrows 13 indicating light incident upon the pixels 12, and light 15 reflecting from the pixel 12 on the left. Although not illustrated in detail, it will be understood by a person having ordinary skill in the art that most of the light 13 incident upon the pixels 12 will be transmitted through the transparent substrate 20, toward the optical stack 16. A portion of the light incident upon the optical stack 16 will be transmitted through the partially reflective layer of the optical stack 16, and a portion will be reflected back through the transparent substrate 20. The portion of light 13 that is transmitted through the optical stack 16 will be reflected at the movable reflective layer 14, back toward (and through) the transparent substrate 20. Interference (constructive or destructive) between the light reflected from the partially reflective layer of the optical stack 16 and the light reflected from the movable reflective layer 14 will determine the wavelength(s) of light 15 reflected from the pixel 12.

The optical stack 16 can include a single layer or several layers. The layer(s) can include one or more of an electrode layer, a partially reflective and partially transmissive layer and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals, such as chromium (Cr), semiconductors, and dielectrics. The partially reflective layer can be formed of one or more layers of materials, and each of the layers can be formed of a single material or a combination of materials. In some implementations, the optical stack 16 can include a single semi-transparent thickness of metal or semiconductor which serves as both an optical absorber and electrical conductor, while different, electrically more conductive layers or portions (e.g., of the optical stack 16 or of other structures of the IMOD) can serve to bus signals between IMOD pixels. The optical stack 16 also can include one or more insulating or dielectric layers covering one or more conductive layers or an electrically conductive/optically absorptive layer.

In some implementations, the layer(s) of the optical stack 16 can be patterned into parallel strips, and may form row electrodes in a display device as described further below. As will be understood by one having ordinary skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of posts 18 and an intervening sacrificial material deposited between the posts 18. When the sacrificial material is etched away, a defined gap 19, or optical cavity, can be formed between the movable reflective layer 14 and the optical stack 16. In some implementations, the spacing between posts 18 may be approximately 1-1000 um, while the gap 19 may be less than <10,000 Angstroms (Å).

In some implementations, each pixel of the IMOD, whether in the actuated or relaxed state, is essentially a capacitor formed by the fixed and moving reflective layers. When no voltage is applied, the movable reflective layer 14 remains in a mechanically relaxed state, as illustrated by the pixel 12 on the left in FIG. 1, with the gap 19 between the movable reflective layer 14 and optical stack 16. However, when a potential difference, a voltage, is applied to at least one of a selected row and column, the capacitor formed at the intersection of the row and column electrodes at the corresponding pixel becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated pixel 12 on the right in FIG. 1. The behavior is the same regardless of the polarity of the applied potential difference. Though a series of pixels in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
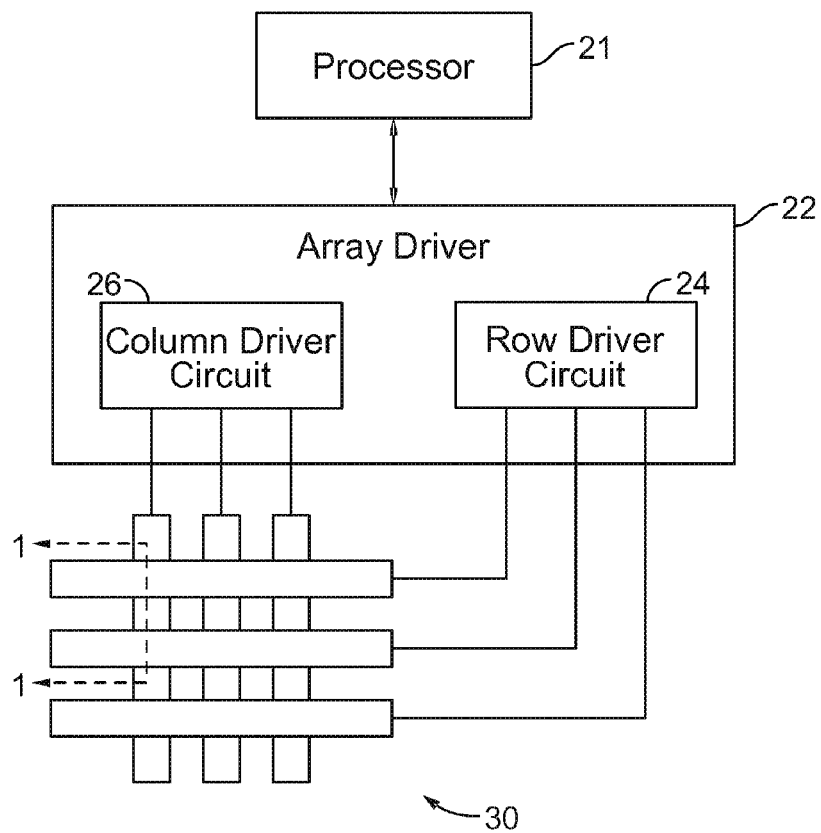
FIG. 2 shows an example of a system block diagram illustrating an electronic device incorporating a 3×3 interferometric modulator display.

FIG. 2 shows an example of a system block diagram illustrating an electronic device incorporating a 3×3 interferometric modulator display. The electronic device includes a processor 21 that may be configured to execute one or more software modules. In addition to executing an operating system, the processor 21 may be configured to execute one or more software applications, including a web browser, a telephone application, an email program, or any other software application.

The processor 21 can be configured to communicate with an array driver 22. The array driver 22 can include a row driver circuit 24 and a column driver circuit 26 that provide signals to, for example, a display array or panel 30. The cross section of the IMOD display device illustrated in FIG. 1 is shown by the lines 1-1 in FIG. 2. Although FIG. 2 illustrates a 3×3 array of IMODs for the sake of clarity, the display array 30 may contain a very large number of IMODs, and may have a different number of IMODs in rows than in columns, and vice versa.

Figures 3, 4:
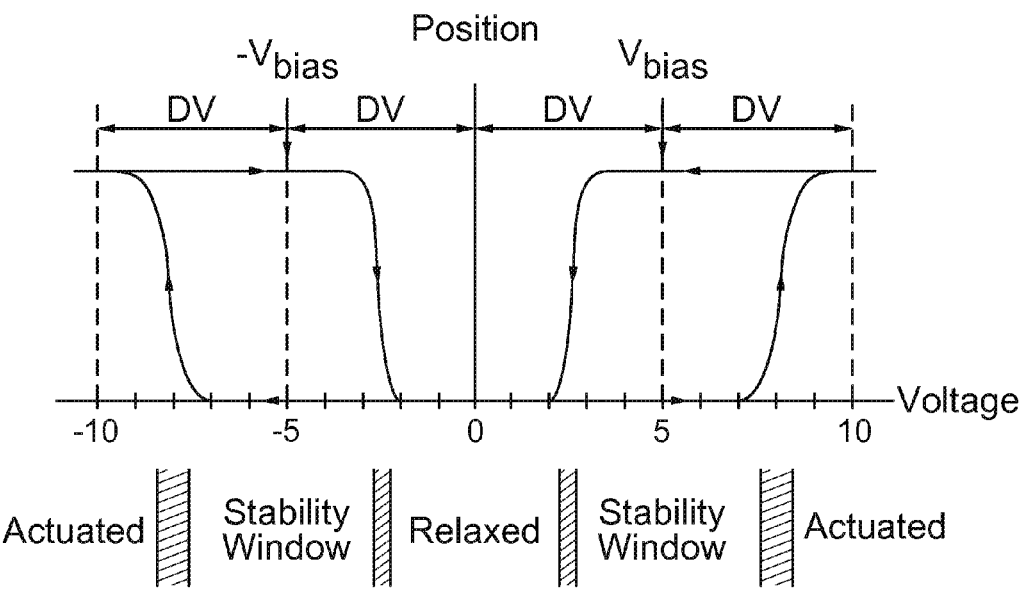
FIG. 3 shows an example of a diagram illustrating movable reflective layer position versus applied voltage for the interferometric modulator of FIG. 1.
FIG. 4 shows an example of a table illustrating various states of an interferometric modulator when various common and segment voltages are applied.

FIG. 3 shows an example of a diagram illustrating movable reflective layer position versus applied voltage for the interferometric modulator of FIG. 1. For MEMS interferometric modulators, the row/column (i.e., common/segment) write procedure may take advantage of a hysteresis property of these devices as illustrated in FIG. 3. An interferometric modulator may use, in one example implementation, about a 10-volt potential difference to cause the movable reflective layer, or mirror, to change from the relaxed state to the actuated state. When the voltage is reduced from that value, the movable reflective layer maintains its state as the voltage drops back below, in this example, 10 volts, however, the movable reflective layer does not relax completely until the voltage drops below 2 volts. Thus, a range of voltage, approximately 3 to 7 volts, in this example, as shown in FIG. 3, exists where there is a window of applied voltage within which the device is stable in either the relaxed or actuated state. This is referred to herein as the "hysteresis window" or "stability window." For a display array 30 having the hysteresis characteristics of FIG. 3, the row/column write procedure can be designed to address one or more rows at a time, such that during the addressing of a given row, pixels in the addressed row that are to be actuated are exposed to a voltage difference of about, in this example, 10 volts, and pixels that are to be relaxed are exposed to a voltage difference of near zero volts. After addressing, the pixels can be exposed to a steady state or bias voltage difference of approximately 5 volts in this example, such that they remain in the previous strobing state. In this example, after being addressed, each pixel sees a potential difference within the "stability window" of about 3-7 volts. This hysteresis property feature enables the pixel design, such as that illustrated in FIG. 1, to remain stable in either an actuated or relaxed pre-existing state under the same applied voltage conditions. Since each IMOD pixel, whether in the actuated or relaxed state, is essentially a capacitor formed by the fixed and moving reflective layers, this stable state can be held at a steady voltage within the hysteresis window without substantially consuming or losing power. Moreover, essentially little or no current flows into the IMOD pixel if the applied voltage potential remains substantially fixed.

In some implementations, a frame of an image may be created by applying data signals in the form of "segment" voltages along the set of column electrodes, in accordance with the desired change (if any) to the state of the pixels in a given row. Each row of the array can be addressed in turn, such that the frame is written one row at a time. To write the desired data to the pixels in a first row, segment voltages corresponding to the desired state of the pixels in the first row can be applied on the column electrodes, and a first row pulse in the form of a specific "common" voltage or signal can be applied to the first row electrode. The set of segment voltages can then be changed to correspond to the desired change (if any) to the state of the pixels in the second row, and a second common voltage can be applied to the second row electrode. In some implementations, the pixels in the first row are unaffected by the change in the segment voltages applied along the column electrodes, and remain in the state they were set to during the first common voltage row pulse. This process may be repeated for the entire series of rows, or alternatively, columns, in a sequential fashion to produce the image frame. The frames can be refreshed and/or updated with new image data by continually repeating this process at some desired number of frames per second.

The combination of segment and common signals applied across each pixel (that is, the potential difference across each pixel) determines the resulting state of each pixel. FIG. 4 shows an example of a table illustrating various states of an interferometric modulator when various common and segment voltages are applied. As will be understood by one having ordinary skill in the art, the "segment" voltages can be applied to either the column electrodes or the row electrodes, and the "common" voltages can be applied to the other of the column electrodes or the row electrodes.

As illustrated in FIG. 4 (as well as in the timing diagram shown in FIG. 5B), when a release voltage $VC_{REL}$ is applied along a common line, all interferometric modulator elements along the common line will be placed in a relaxed state, alternatively referred to as a released or unactuated state, regardless of the voltage applied along the segment lines, i.e., high segment voltage $VS_H$ and low segment voltage $VS_L$. In particular, when the release voltage $VC_{REL}$ is applied along a common line, the potential voltage across the modulator pixels (alternatively referred to as a pixel voltage) is within the relaxation window (see FIG. 3, also referred to as a release window) both when the high segment voltage $VS_H$ and the low segment voltage $VS_L$ are applied along the corresponding segment line for that pixel.

When a hold voltage is applied on a common line, such as a high hold voltage $VC_{HOLD\_H}$ or a low hold voltage $VC_{HOLD\_L}$, the state of the interferometric modulator will remain constant. For example, a relaxed IMOD will remain in a relaxed position, and an actuated IMOD will remain in an actuated position. The hold voltages can be selected such that the pixel voltage will remain within a stability window both when the high segment voltage $VS_H$ and the low segment voltage $VS_L$ are applied along the corresponding segment line. Thus, the segment voltage swing, i.e., the difference between the high $VS_H$ and low segment voltage $VS_L$, is less than the width of either the positive or the negative stability window.

When an addressing, or actuation, voltage is applied on a common line, such as a high addressing voltage $VC_{ADD\_H}$ or a low addressing voltage $VC_{ADD\_L}$, data can be selectively written to the modulators along that line by application of segment voltages along the respective segment lines. The segment voltages may be selected such that actuation is dependent upon the segment voltage applied. When an addressing voltage is applied along a common line, application of one segment voltage will result in a pixel voltage within a stability window, causing the pixel to remain unactuated. In contrast, application of the other segment voltage will result in a pixel voltage beyond the stability window, resulting in actuation of the pixel. The particular segment voltage which causes actuation can vary depending upon which addressing voltage is used. In some implementations, when the high addressing voltage $VC_{ADD\_H}$ is applied along the common line, application of the high segment voltage $VS_H$ can cause a modulator to remain in its current position, while application of the low segment voltage $VS_L$ can cause actuation of the modulator. As a corollary, the effect of the segment voltages can be the opposite when a low addressing voltage $VC_{ADD\_L}$ is applied, with high segment voltage $VS_H$ causing actuation of the modulator, and low segment voltage $VS_L$ having no effect (i.e., remaining stable) on the state of the modulator.

In some implementations, hold voltages, address voltages, and segment voltages may be used which produce the same polarity potential difference across the modulators. In some other implementations, signals can be used which alternate the polarity of the potential difference of the modulators from time to time. Alternation of the polarity across the modulators (that is, alternation of the polarity of write procedures) may reduce or inhibit charge accumulation which could occur after repeated write operations of a single polarity.

Figure 5A:
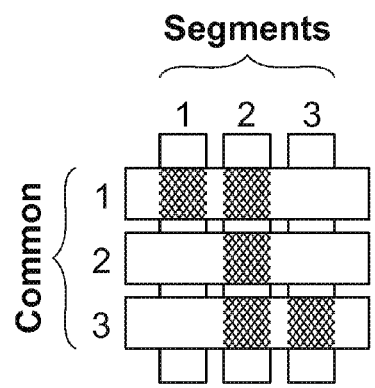
FIG. 5A shows an example of a diagram illustrating a frame of display data in the 3×3 interferometric modulator display of FIG. 2.
Figure 5B:
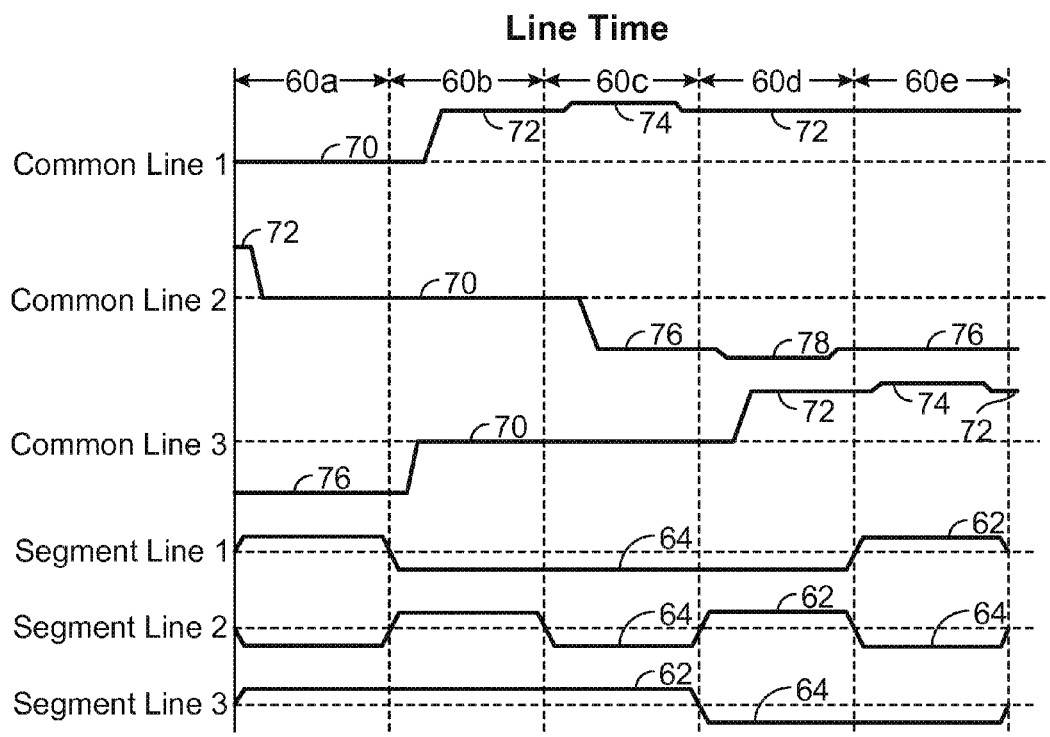
FIG. 5B shows an example of a timing diagram for common and segment signals that may be used to write the frame of display data illustrated in FIG. 5A.

FIG. 5A shows an example of a diagram illustrating a frame of display data in the 3×3 interferometric modulator display of FIG. 2. FIG. 5B shows an example of a timing diagram for common and segment signals that may be used to write the frame of display data illustrated in FIG. 5A. The signals can be applied to a 3×3 array, similar to the array of FIG. 2, which will ultimately result in the line time 60e display arrangement illustrated in FIG. 5A. The actuated modulators in FIG. 5A are in a dark-state, i.e., where a substantial portion of the reflected light is outside of the visible spectrum so as to result in a dark appearance to, for example, a viewer. Prior to writing the frame illustrated in FIG. 5A, the pixels can be in any state, but the write procedure illustrated in the timing diagram of FIG. 5B presumes that each modulator has been released and resides in an unactuated state before the first line time 60a.

During the first line time 60a: a release voltage 70 is applied on common line 1; the voltage applied on common line 2 begins at a high hold voltage 72 and moves to a release voltage 70; and a low hold voltage 76 is applied along common line 3. Thus, the modulators (common 1, segment 1), (1,2) and (1,3) along common line 1 remain in a relaxed, or unactuated, state for the duration of the first line time 60a, the modulators (2,1), (2,2) and (2,3) along common line 2 will move to a relaxed state, and the modulators (3,1), (3,2) and (3,3) along common line 3 will remain in their previous state. With reference to FIG. 4, the segment voltages applied along segment lines 1, 2 and 3 will have no effect on the state of the interferometric modulators, as none of common lines 1, 2 or 3 are being exposed to voltage levels causing actuation during line time 60a (i.e., $VC_{REL}$—relax and $VC_{HOLD\_L}$—stable).

During the second line time 60b, the voltage on common line 1 moves to a high hold voltage 72, and all modulators along common line 1 remain in a relaxed state regardless of the segment voltage applied because no addressing, or actuation, voltage was applied on the common line 1. The modulators along common line 2 remain in a relaxed state due to the application of the release voltage 70, and the modulators (3,1), (3,2) and (3,3) along common line 3 will relax when the voltage along common line 3 moves to a release voltage 70.

During the third line time 60c, common line 1 is addressed by applying a high address voltage 74 on common line 1. Because a low segment voltage 64 is applied along segment lines 1 and 2 during the application of this address voltage, the pixel voltage across modulators (1,1) and (1,2) is greater than the high end of the positive stability window (i.e., the voltage differential exceeded a predefined threshold) of the modulators, and the modulators (1,1) and (1,2) are actuated. Conversely, because a high segment voltage 62 is applied along segment line 3, the pixel voltage across modulator (1,3) is less than that of modulators (1,1) and (1,2), and remains within the positive stability window of the modulator; modulator (1,3) thus remains relaxed. Also during line time 60c, the voltage along common line 2 decreases to a low hold voltage 76, and the voltage along common line 3 remains at a release voltage 70, leaving the modulators along common lines 2 and 3 in a relaxed position.

During the fourth line time 60d, the voltage on common line 1 returns to a high hold voltage 72, leaving the modulators along common line 1 in their respective addressed states. The voltage on common line 2 is decreased to a low address voltage 78. Because a high segment voltage 62 is applied along segment line 2, the pixel voltage across modulator (2,2) is below the lower end of the negative stability window of the modulator, causing the modulator (2,2) to actuate. Conversely, because a low segment voltage 64 is applied along segment lines 1 and 3, the modulators (2,1) and (2,3) remain in a relaxed position. The voltage on common line 3 increases to a high hold voltage 72, leaving the modulators along common line 3 in a relaxed state.

Finally, during the fifth line time 60e, the voltage on common line 1 remains at high hold voltage 72, and the voltage on common line 2 remains at a low hold voltage 76, leaving the modulators along common lines 1 and 2 in their respective addressed states. The voltage on common line 3 increases to a high address voltage 74 to address the modulators along common line 3. As a low segment voltage 64 is applied on segment lines 2 and 3, the modulators (3,2) and (3,3) actuate, while the high segment voltage 62 applied along segment line 1 causes modulator (3,1) to remain in a relaxed position. Thus, at the end of the fifth line time 60e, the 3×3 pixel array is in the state shown in FIG. 5A, and will remain in that state as long as the hold voltages are applied along the common lines, regardless of variations in the segment voltage which may occur when modulators along other common lines (not shown) are being addressed.

In the timing diagram of FIG. 5B, a given write procedure (i.e., line times 60a-60e) can include the use of either high hold and address voltages, or low hold and address voltages. Once the write procedure has been completed for a given common line (and the common voltage is set to the hold voltage having the same polarity as the actuation voltage), the pixel voltage remains within a given stability window, and does not pass through the relaxation window until a release voltage is applied on that common line. Furthermore, as each modulator is released as part of the write procedure prior to addressing the modulator, the actuation time of a modulator, rather than the release time, may determine the line time. Specifically, in implementations in which the release time of a modulator is greater than the actuation time, the release voltage may be applied for longer than a single line time, as depicted in FIG. 5B. In some other implementations, voltages applied along common lines or segment lines may vary to account for variations in the actuation and release voltages of different modulators, such as modulators of different colors.

Figure 6A:
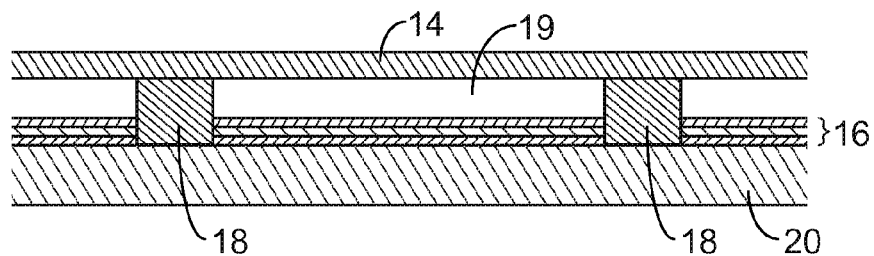
FIG. 6A shows an example of a partial cross-section of the interferometric modulator display of FIG. 1.
Figure 6B:
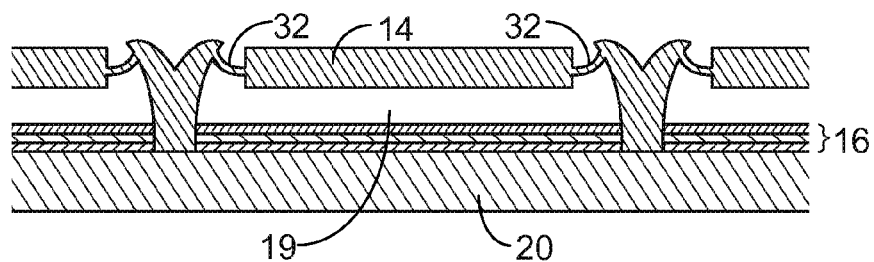
FIGS. 6B-6E show examples of cross-sections of varying implementations of interferometric modulators.
Figure 6C:
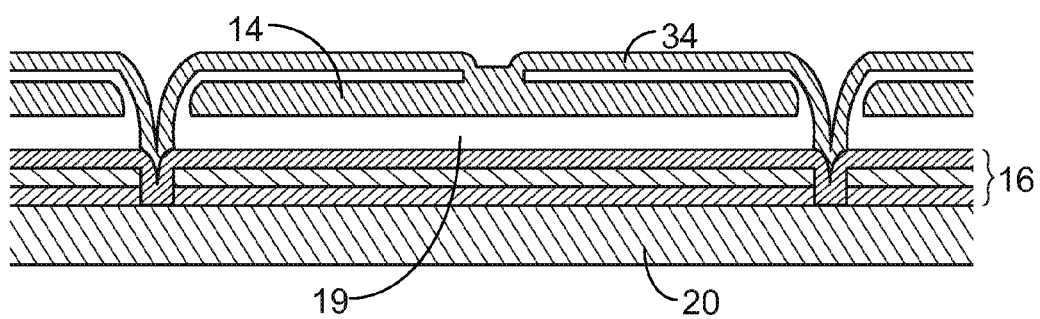

The details of the structure of interferometric modulators that operate in accordance with the principles set forth above may vary widely. For example, FIGS. 6A-6E show examples of cross-sections of varying implementations of interferometric modulators, including the movable reflective layer 14 and its supporting structures. FIG. 6A shows an example of a partial cross-section of the interferometric modulator display of FIG. 1, where a strip of metal material, i.e., the movable reflective layer 14 is deposited on supports 18 extending orthogonally from the substrate 20. In FIG. 6B, the movable reflective layer 14 of each IMOD is generally square or rectangular in shape and attached to supports at or near the corners, on tethers 32. In FIG. 6C, the movable reflective layer 14 is generally square or rectangular in shape and suspended from a deformable layer 34, which may include a flexible metal. The deformable layer 34 can connect, directly or indirectly, to the substrate 20 around the perimeter of the movable reflective layer 14. These connections are herein referred to as support posts. The implementation shown in FIG. 6C has additional benefits deriving from the decoupling of the optical functions of the movable reflective layer 14 from its mechanical functions, which are carried out by the deformable layer 34. This decoupling allows the structural design and materials used for the reflective layer 14 and those used for the deformable layer 34 to be optimized independently of one another.

Figure 6D:
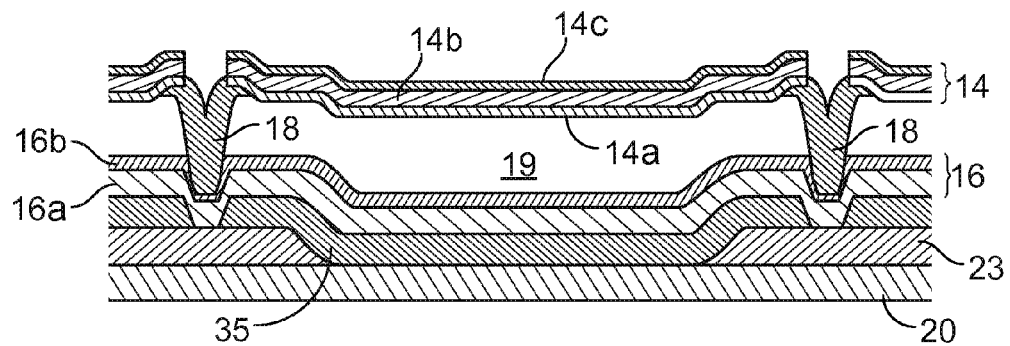

FIG. 6D shows another example of an IMOD, where the movable reflective layer 14 includes a reflective sub-layer 14a. The movable reflective layer 14 rests on a support structure, such as support posts 18. The support posts 18 provide separation of the movable reflective layer 14 from the lower stationary electrode (i.e., part of the optical stack 16 in the illustrated IMOD) so that a gap 19 is formed between the movable reflective layer 14 and the optical stack 16, for example when the movable reflective layer 14 is in a relaxed position. The movable reflective layer 14 also can include a conductive layer 14c, which may be configured to serve as an electrode, and a support layer 14b. In this example, the conductive layer 14c is disposed on one side of the support layer 14b, distal from the substrate 20, and the reflective sub-layer 14a is disposed on the other side of the support layer 14b, proximal to the substrate 20. In some implementations, the reflective sub-layer 14a can be conductive and can be disposed between the support layer 14b and the optical stack 16. The support layer 14b can include one or more layers of a dielectric material, for example, silicon oxynitride (SiON) or silicon dioxide ($SiO_2$). In some implementations, the support layer 14b can be a stack of layers, such as, for example, a $SiO_2$/SiON/$SiO_2$ tri-layer stack. Either or both of the reflective sub-layer 14a and the conductive layer 14c can include, for example, an aluminum (Al) alloy with about 0.5% copper (Cu), or another reflective metallic material. Employing conductive layers 14a, 14c above and below the dielectric support layer 14b can balance stresses and provide enhanced conduction. In some implementations, the reflective sub-layer 14a and the conductive layer 14c can be formed of different materials for a variety of design purposes, such as achieving specific stress profiles within the movable reflective layer 14.

As illustrated in FIG. 6D, some implementations also can include a black mask structure 23. The black mask structure 23 can be formed in optically inactive regions (such as between pixels or under posts 18) to absorb ambient or stray light. The black mask structure 23 also can improve the optical properties of a display device by inhibiting light from being reflected from or transmitted through inactive portions of the display, thereby increasing the contrast ratio. Additionally, the black mask structure 23 can be conductive and be configured to function as an electrical bussing layer. In some implementations, the row electrodes can be connected to the black mask structure 23 to reduce the resistance of the connected row electrode. The black mask structure 23 can be formed using a variety of methods, including deposition and patterning techniques. The black mask structure 23 can include one or more layers. For example, in some implementations, the black mask structure 23 includes a molybdenum-chromium (MoCr) layer that serves as an optical absorber, a layer, and an aluminum alloy that serves as a reflector and a bussing layer, with a thickness in the range of about 30-80 Å, 500-1000 Å, and 500-6000 Å, respectively. The one or more layers can be patterned using a variety of techniques, including photolithography and dry etching, including, for example, carbon tetrafluoromethane ($CF_4$) and/or oxygen ($O_2$) for the MoCr and $SiO_2$ layers and chlorine ($Cl_2$) and/or boron trichloride ($BCl_3$) for the aluminum alloy layer. In some implementations, the black mask 23 can be an etalon or interferometric stack structure. In such interferometric stack black mask structures 23, the conductive absorbers can be used to transmit or bus signals between lower, stationary electrodes in the optical stack 16 of each row or column. In some implementations, a spacer layer 35 can serve to generally electrically isolate the absorber layer 16a from the conductive layers in the black mask 23.

Figure 6E:
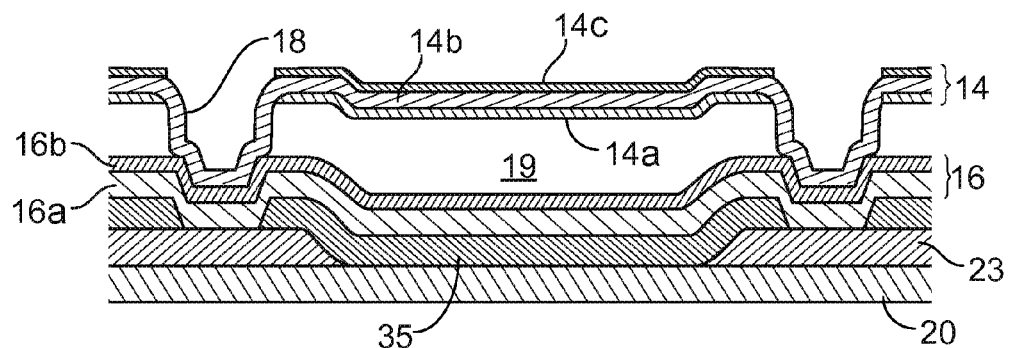

FIG. 6E shows another example of an IMOD, where the movable reflective layer 14 is self supporting. In contrast with FIG. 6D, the implementation of FIG. 6E does not include support posts 18. Instead, the movable reflective layer 14 contacts the underlying optical stack 16 at multiple locations, and the curvature of the movable reflective layer 14 provides sufficient support that the movable reflective layer 14 returns to the unactuated position of FIG. 6E when the voltage across the interferometric modulator is insufficient to cause actuation. The optical stack 16, which may contain a plurality of several different layers, is shown here for clarity including an optical absorber 16a, and a dielectric 16b. In some implementations, the optical absorber 16a may serve both as a fixed electrode and as a partially reflective layer. In some implementations, the optical absorber 16a is an order of magnitude (ten times or more) thinner than the movable reflective layer 14. In some implementations, optical absorber 16a is thinner than reflective sub-layer 14a.

In implementations such as those shown in FIGS. 6A-6E, the IMODs function as direct-view devices, in which images are viewed from the front side of the transparent substrate 20, i.e., the side opposite to that upon which the modulator is arranged. In these implementations, the back portions of the device (that is, any portion of the display device behind the movable reflective layer 14, including, for example, the deformable layer 34 illustrated in FIG. 6C) can be configured and operated upon without impacting or negatively affecting the image quality of the display device, because the reflective layer 14 optically shields those portions of the device. For example, in some implementations a bus structure (not illustrated) can be included behind the movable reflective layer 14 which provides the ability to separate the optical properties of the modulator from the electromechanical properties of the modulator, such as voltage addressing and the movements that result from such addressing. Additionally, the implementations of FIGS. 6A-6E can simplify processing, such as, for example, patterning.

Figure 7:
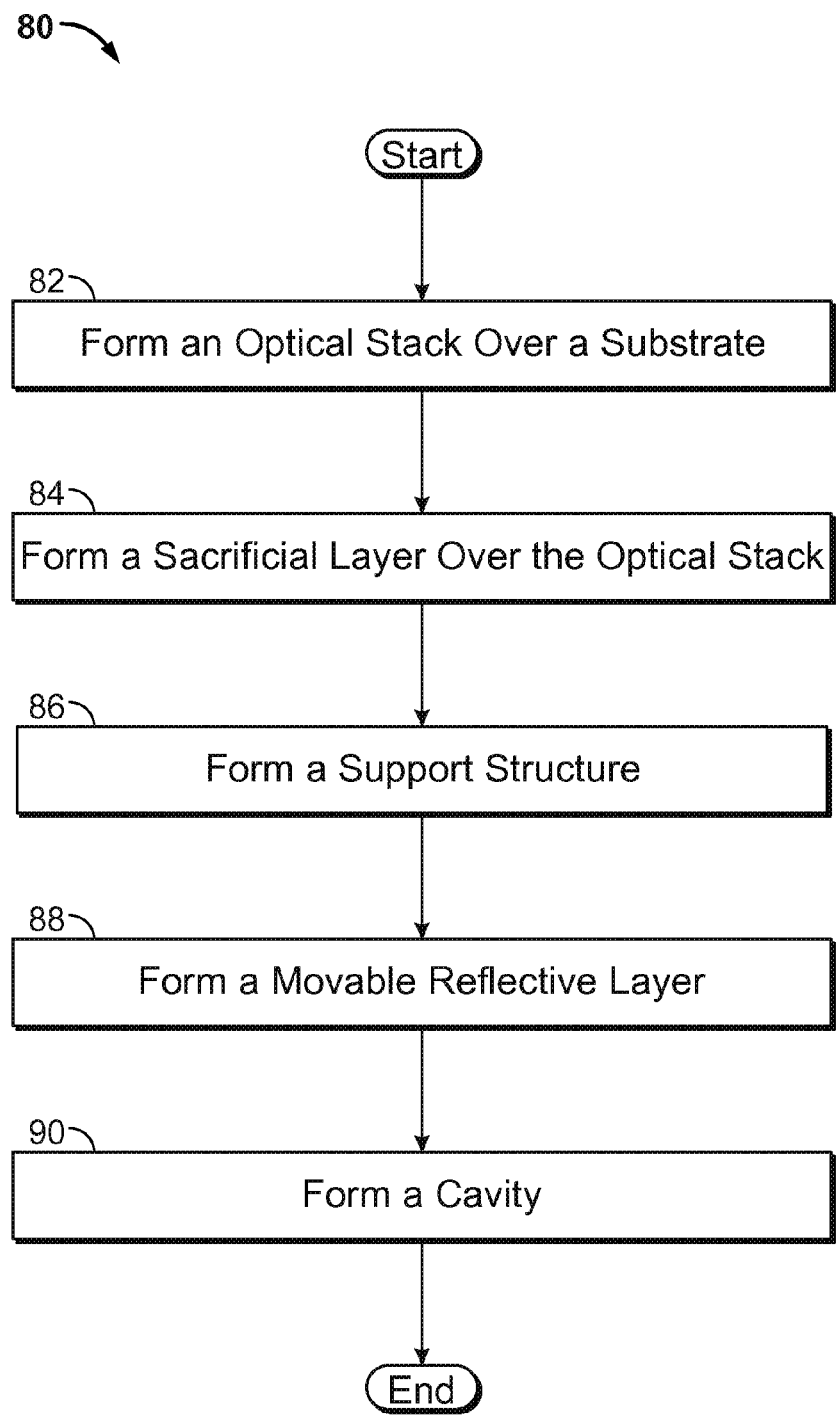
FIG. 7 shows an example of a flow diagram illustrating a manufacturing process for an interferometric modulator.
Figure 8A:
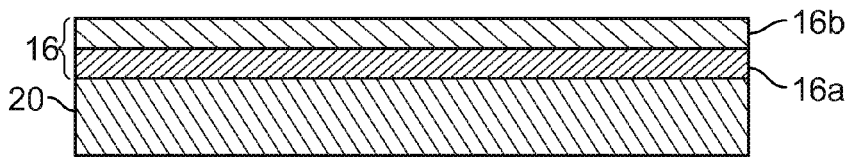
FIGS. 8A-8E show examples of cross-sectional schematic illustrations of various stages in a method of making an interferometric modulator.

FIG. 7 shows an example of a flow diagram illustrating a manufacturing process 80 for an interferometric modulator, and FIGS. 8A-8E show examples of cross-sectional schematic illustrations of corresponding stages of such a manufacturing process 80. In some implementations, the manufacturing process 80 can be implemented to manufacture an electromechanical systems device such as interferometric modulators of the general type illustrated in FIGS. 1 and 6. The manufacture of an electromechanical systems device can also include other blocks not shown in FIG. 7. With reference to FIGS. 1, 6 and 7, the process 80 begins at block 82 with the formation of the optical stack 16 over the substrate 20. FIG. 8A illustrates such an optical stack 16 formed over the substrate 20. The substrate 20 may be a transparent substrate such as glass or plastic, it may be flexible or relatively stiff and unbending, and may have been subjected to prior preparation processes, such as cleaning, to facilitate efficient formation of the optical stack 16. As discussed above, the optical stack 16 can be electrically conductive, partially transparent and partially reflective and may be fabricated, for example, by depositing one or more layers having the desired properties onto the transparent substrate 20. In FIG. 8A, the optical stack 16 includes a multilayer structure having sub-layers 16a and 16b, although more or fewer sub-layers may be included in some other implementations. In some implementations, one of the sub-layers 16a, 16b can be configured with both optically absorptive and electrically conductive properties, such as the combined conductor/absorber sub-layer 16a. Additionally, one or more of the sub-layers 16a, 16b can be patterned into parallel strips, and may form row electrodes in a display device. Such patterning can be performed by a masking and etching process or another suitable process known in the art. In some implementations, one of the sub-layers 16a, 16b can be an insulating or dielectric layer, such as sub-layer 16b that is deposited over one or more metal layers (e.g., one or more reflective and/or conductive layers). In addition, the optical stack 16 can be patterned into individual and parallel strips that form the rows of the display. It is noted that FIGS. 8A-8E may not be drawn to scale. For example, in some implementations, one of the sub-layers of the optical stack, the optically absorptive layer, may be very thin, although sub-layers 16a, 16b are shown somewhat thick in FIGS. 8A-8E.

Figure 8B:
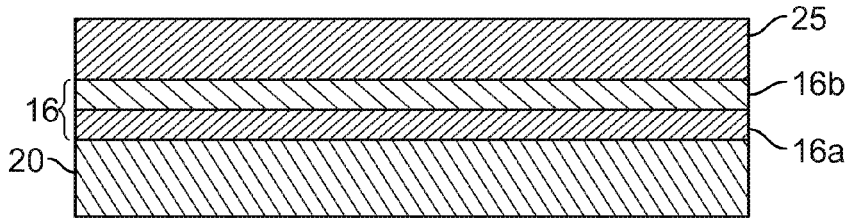

The process 80 continues at block 84 with the formation of a sacrificial layer 25 over the optical stack 16. The sacrificial layer 25 is later removed (see block 90) to form the cavity 19 and thus the sacrificial layer 25 is not shown in the resulting interferometric modulators 12 illustrated in FIG. 1. FIG. 8B illustrates a partially fabricated device including a sacrificial layer 25 formed over the optical stack 16. The formation of the sacrificial layer 25 over the optical stack 16 may include deposition of a xenon difluoride (XeF$_2$)-etchable material such as molybdenum (Mo) or amorphous silicon (a-Si), in a thickness selected to provide, after subsequent removal, a gap or cavity 19 (see also FIGS. 1 and 8E) having a desired design size. Deposition of the sacrificial material may be carried out using deposition techniques such as physical vapor deposition (PVD, which includes many different techniques, such as sputtering), plasma-enhanced chemical vapor deposition (PECVD), thermal chemical vapor deposition (thermal CVD), or spin-coating.

Figure 8C:
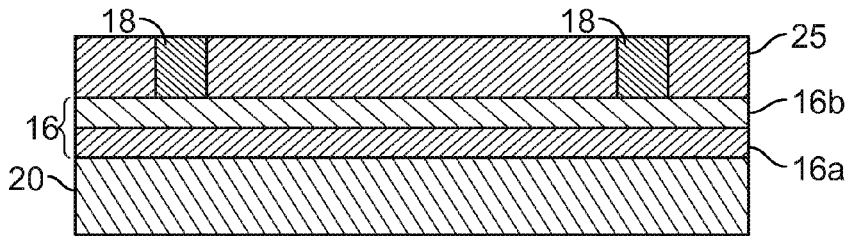

The process 80 continues at block 86 with the formation of a support structure such as post 18, illustrated in FIGS. 1, 6 and 8C. The formation of the post 18 may include patterning the sacrificial layer 25 to form a support structure aperture, then depositing a material (such as a polymer or an inorganic material such as silicon oxide) into the aperture to form the post 18, using a deposition method such as PVD, PECVD, thermal CVD, or spin-coating. In some implementations, the support structure aperture formed in the sacrificial layer can extend through both the sacrificial layer 25 and the optical stack 16 to the underlying substrate 20, so that the lower end of the post 18 contacts the substrate 20 as illustrated in FIG. 6A. Alternatively, as depicted in FIG. 8C, the aperture formed in the sacrificial layer 25 can extend through the sacrificial layer 25, but not through the optical stack 16. For example, FIG. 8E illustrates the lower ends of the support posts 18 in contact with an upper surface of the optical stack 16. The post 18, or other support structures, may be formed by depositing a layer of support structure material over the sacrificial layer 25 and patterning portions of the support structure material located away from apertures in the sacrificial layer 25. The support structures may be located within the apertures, as illustrated in FIG. 8C, but also can, at least partially, extend over a portion of the sacrificial layer 25. As noted above, the patterning of the sacrificial layer 25 and/or the support posts 18 can be performed by a patterning and etching process, but also may be performed by alternative etching methods.

Figure 8D:
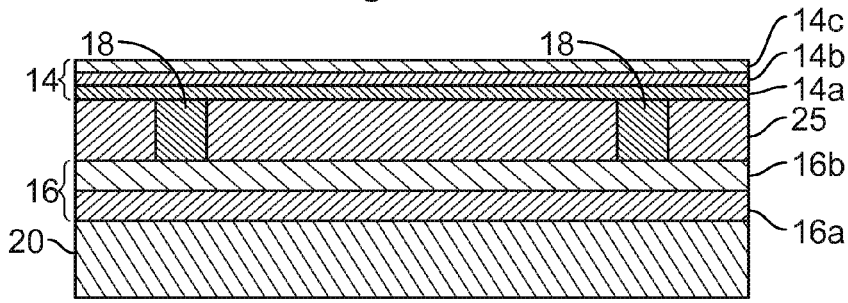
Figure 8E:
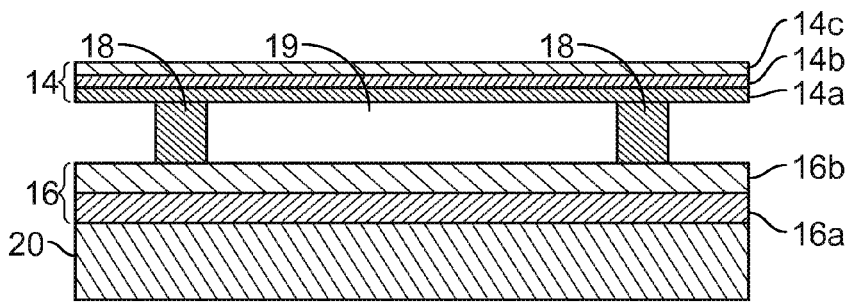

The process 80 continues at block 88 with the formation of a movable reflective layer or membrane such as the movable reflective layer 14 illustrated in FIGS. 1, 6 and 8D. The movable reflective layer 14 may be formed by employing one or more deposition steps including, for example, reflective layer (such as aluminum, aluminum alloy, or other reflective layer) deposition, along with one or more patterning, masking, and/or etching steps. The movable reflective layer 14 can be electrically conductive, and referred to as an electrically conductive layer. In some implementations, the movable reflective layer 14 may include a plurality of sub-layers 14a, 14b, 14c as shown in FIG. 8D. In some implementations, one or more of the sub-layers, such as sub-layers 14a, 14c, may include highly reflective sub-layers selected for their optical properties, and another sub-layer 14b may include a mechanical sub-layer selected for its mechanical properties. Since the sacrificial layer 25 is still present in the partially fabricated interferometric modulator formed at block 88, the movable reflective layer 14 is typically not movable at this stage. A partially fabricated IMOD that contains a sacrificial layer 25 may also be referred to herein as an "unreleased" IMOD. As described above in connection with FIG. 1, the movable reflective layer 14 can be patterned into individual and parallel strips that form the columns of the display.

The process 80 continues at block 90 with the formation of a cavity, such as cavity 19 illustrated in FIGS. 1, 6 and 8E. The cavity 19 may be formed by exposing the sacrificial material 25 (deposited at block 84) to an etchant. For example, an etchable sacrificial material such as Mo or amorphous Si may be removed by dry chemical etching, by exposing the sacrificial layer 25 to a gaseous or vaporous etchant, such as vapors derived from solid XeF$_2$, for a period of time that is effective to remove the desired amount of material. The sacrificial material is typically selectively removed relative to the structures surrounding the cavity 19. Other etching methods, such as wet etching and/or plasma etching, also may be used. Since the sacrificial layer 25 is removed during block 90, the movable reflective layer 14 is typically movable after this stage. After removal of the sacrificial material 25, the resulting fully or partially fabricated IMOD may be referred to herein as a "released" IMOD.

Implementations described herein relate to glass packaging of electromechanical systems devices such as IMODs and other MEMS or NEMS devices. In some implementations, methods of encapsulating MEMS devices are described. Encapsulation of MEMS devices can provide a controlled atmosphere for operation of the devices. In some implementations, the methods are batch wafer or panel encapsulation processes performed prior to die singulation. While implementations of the methods of encapsulation and the resulting packaged devices are described chiefly in the context of packaging of MEMS devices, the methods and packages are not so limited and may be applied in other contexts in which a package of is employed, for example in packaging of NEMS or other EMS devices, integrated circuit (IC) devices or other devices.

Batch level encapsulation of MEMS devices refers to encapsulating a plurality of MEMS devices simultaneously. In some implementations, certain operations in a batch level encapsulation process are performed once for the plurality of MEMS devices, rather than performed separately for each device. In some implementations, the batch level processes involve encapsulating a plurality of devices that have been fabricated on a wafer, panel or other substrate prior to singulation of the wafer, panel or other substrate into individual dies. In some implementations, the batch level methods involve providing a cover glass and a device substrate, the device substrate including a plurality of devices and the cover glass configured to encapsulate at least some of the plurality of devices. While the below discussion refers to the device substrate as including a glass substrate with an array of MEMS devices, it is understood that substrates other than glass may be used. For example, plastic or silicon substrates may be used. Similarly, while the below discussion refers to the cover glass, it is understood dielectric materials other than glass may be used. In some implementations, a device substrate material has a coefficient of thermal expansion (CTE) that matches a cover material.

Figure 9:
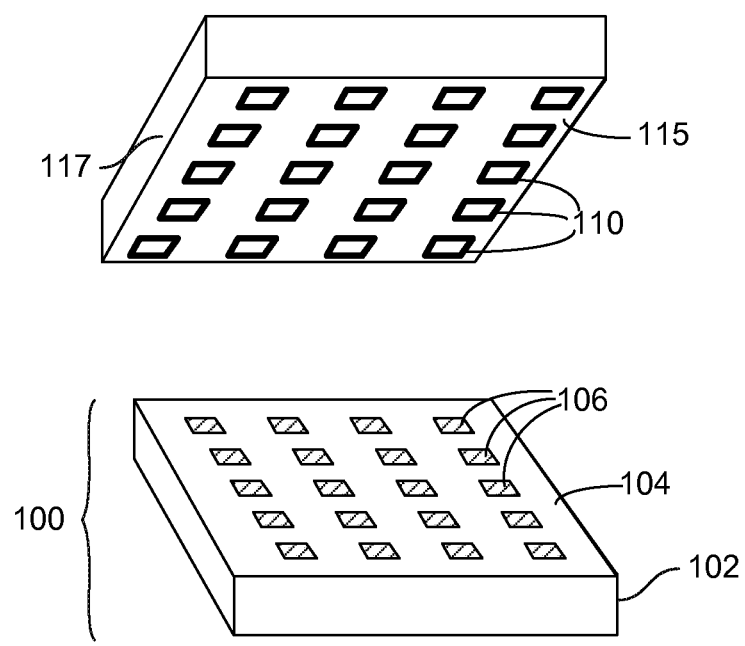
FIG. 9 shows an example of a simplified schematic illustration of a device substrate and a cover glass prior to encapsulation.

FIG. 9 shows an example of a simplified schematic illustration of a device substrate and a cover glass prior to encapsulation. In the example of FIG. 9, device substrate 100 includes MEMS devices 106 arrayed on a top surface 104 of glass substrate 102. In some implementations, each of the MEMS devices 106 is configured for eventual singulation into a die. Examples of MEMS devices 106 include IMODs, gyroscopes, accelerometers, pressure and other kinds of sensors, microphones, microspeakers, and the like. In addition to MEMS devices, any number of other components such as pads, traces, interconnects and the like may be present on any surface of or through the device substrate 100. Any number of MEMS devices 106 may be arrayed or otherwise arranged on the top surface 104 of glass substrate 102. For example, tens, hundreds, thousands or more MEMS devices may be fabricated or arranged on a single substrate. In some implementations, the MEMS devices 106 may be singulated from the substrate or substrates that the MEMS device 106 were fabricated on and then attached to the glass substrate 102. The devices and associated components may all be the same or may differ across the substrate according to the desired implementation. The height of MEMS devices 106 may be, for example, between about 0.1 microns and 100 microns. For example, a MEMS device may have a height of between about 0.2 microns and 25 microns.

In some implementations glass substrate 102 is a planar substrate having substantially parallel opposing surfaces and may be of any appropriate area and thickness. For example, in some implementations, a device substrate such as a glass plate or panel having an area on the order of four square meters or greater is provided with a thickness, for example, of 0.3, 0.5, or 0.7 millimeters. Alternatively, round substrates with diameters of 100 millimeters, 150 millimeters, or other diameters may be provided. In some other implementations, square or rectangular sub-panels cut from a larger panel of glass or other substrate material may be provided. In some implementations, the substrate thickness may be between about 300 and 700 microns, such as 500 microns, though thicker or thinner substrates can be used according to the desired implementation. In some implementations, the packaged, encapsulated MEMS device, including the substrate, is configured to mount onto a printed circuit board (PCB) after singulation.

Glass substrate 102 may be transparent, such as transparent substrate 20 described above with respect to FIGS. 6A-6E and 8A-8E, or may be non-transparent. Glass substrate 102 may be or include, for example, a borosilicate glass, a soda lime glass, quartz, Pyrex, or other suitable glass material. In other implementations, the device substrate may be an insulating non-glass material. For example, a device substrate can include a plastic or silicon substrate having a plurality of devices disposed thereon.

Cover glass 117 is a planar substrate having substantially parallel opposing interior and exterior surfaces. Interior surface 115 of cover glass 117 will be on the interior of the package formed by joining the cover glass 117 to the device substrate 100, with the exterior surface (not shown) on the exterior of the package. Interior surface 115 is configured to be joined to top surface 104 of device substrate 100. In the example of FIG. 9, cover glass 117 includes a plurality of cavities 110 in interior surface 115 configured to accommodate MEMS devices 106 of device substrate 100. In some implementations, a device substrate can include cavities that accommodate the MEMS devices (not shown). A cover glass covering such MEMS devices may or may not include cavities in the surface joined to the device substrate according to the desired implementation.

The cover glass can be sealed to the device substrate to provide a seal surrounding each device. In some implementations the seals are narrow, being about 100 microns to about 1 mm in width. In some implementations, a seal including joined metal rings is between about 100 and 500 microns in width, for example between about 100 and 200 microns in width.

In some implementations, the cover glass includes integrated electrical connectivity. For example, in some implementations, the cover glass includes conductive interconnects that extend through the cover glass and are configured to provide a point of electrical connection to the MEMS device. As such, the cover glass can serve as a back glass with integrated electrical connectivity for a device formed on a device substrate.

Cover glass 117 may be of any appropriate area. For example, in some implementations, the cover glass has an area on the order of four square meters or greater. Alternatively, round substrates with diameters of 100 millimeters, 150 millimeters, or other diameters may be provided. In some implementations, cover glass 117 is approximately the same area and shape as glass substrate 102 of device substrate 100. In the example of FIG. 9, cover glass 117 includes one cavity 110 for each MEMS device 106. In other implementations, the area of the cover glass 117 may be smaller than that of the device substrate. In some such implementations, the cover glass 117 is configured to encapsulate fewer devices than the number of devices on the device substrate. In these implementations, multiple cover glasses can be used to encapsulate the MEMS devices. Cover glass 117 has a thickness of between about 30 and 150 microns, for example, between about 30 and 100 microns. Also as described further below, in some implementations, cover glass 117 can be attached to a carrier substrate (not shown) to facilitate handling prior to and during the joining process.

Figure 10:
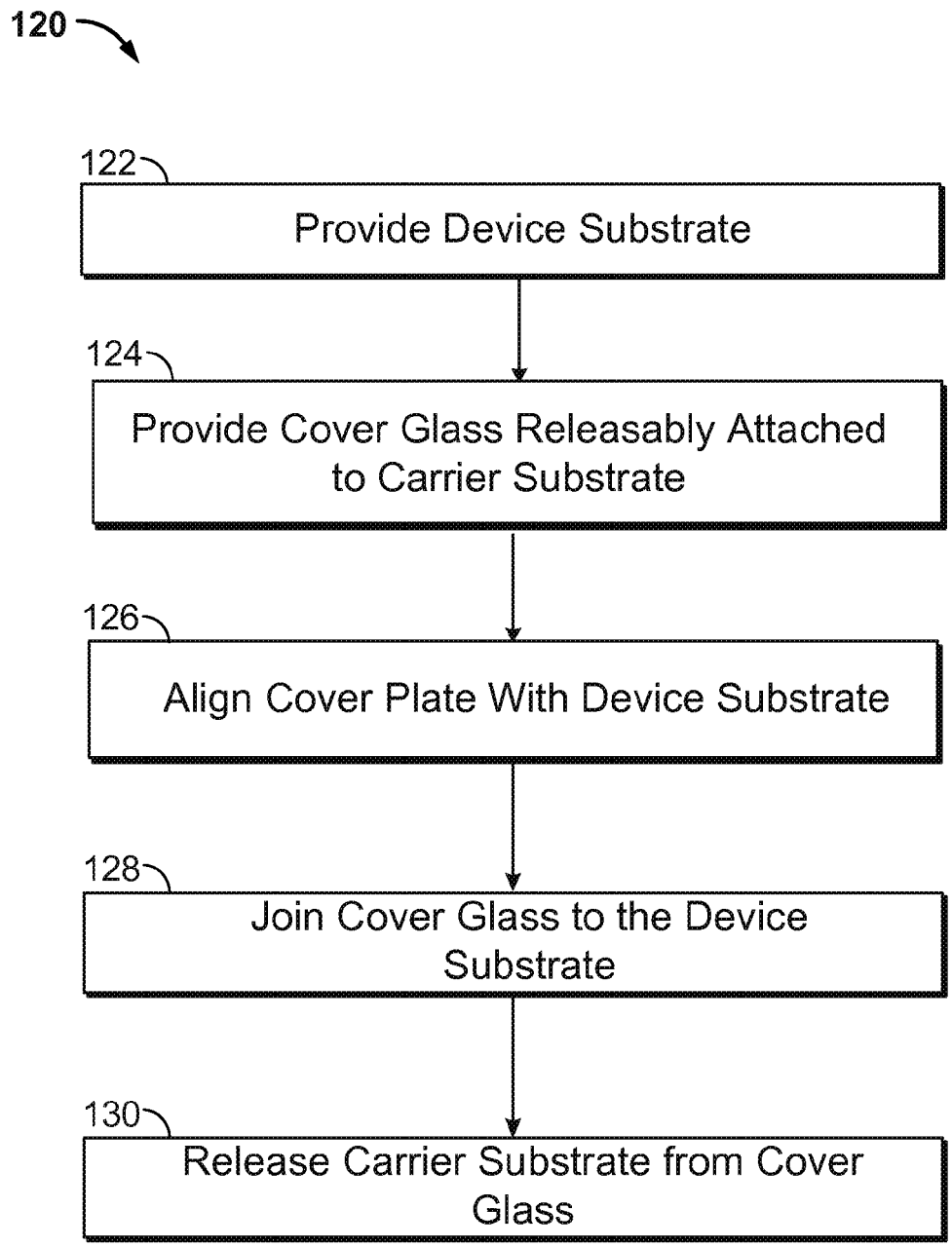
FIG. 10 shows an example of a flow diagram illustrating a process for encapsulating devices with a cover glass.

FIG. 10 shows an example of a flow diagram illustrating a process for encapsulating devices with a cover glass. FIGS. 11A-11F show examples of cross-sectional schematic illustrations of various stages of in a method of encapsulating a device with a cover glass. Further details and examples of forming cover glasses are given below with respect to FIGS. 14-16J.

In FIG. 10, a process 120 begins at block 122 by providing a device substrate. A device substrate is a substrate that has one or more devices disposed thereon. Examples of device substrates are described above with respect to FIG. 9. In some implementations, the devices are or include one or more MEMS devices previously fabricated on, attached to or placed on the device substrate. In some implementations, the substrate is substantially planar having substantially parallel major surfaces (also referred to as top and bottom surfaces). Each surface may include various recessed or raised features. For example, a surface may include cavities to accommodate devices or components thereof.

Figure 11A:
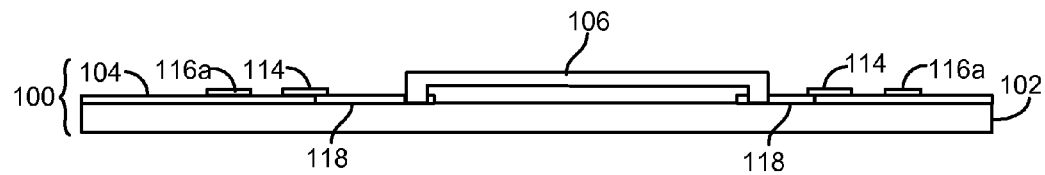
FIGS. 11A-11F show examples of cross-sectional schematic illustrations of various stages of in a method of encapsulating a device with a cover glass.

FIG. 11A is an example of a cross-sectional illustration of a portion of a device substrate. (It should be noted that the geometry is not shown to scale with the illustration expanded the z-direction.) The depicted portion includes one repeating unit of a device substrate 100, including MEMS device 106 and associated components on top surface 104 of a glass substrate 102. In some implementations the entire device substrate (not shown) includes a plurality of such devices arrayed on top surface 104. In the example depicted in FIG. 11A, the associated components include bond pads 114 and metal routing 118. Bond pads 114 are metallized areas to which connections can be made. In some implementations, bond pads 114 are configured to connect to metal routing the cover glass, a described further below. Metal routing 118 provides electrical connection from MEMS device 106 to bond pads 114. The presence, number and arrangement of components such as bond pads, routing and the like may vary according to the desired implementation. A joining ring 116a surrounds MEMS device 106. As described further below with reference to FIG. 11D, joining ring 116a provides a point of attachment for the cover glass such that a seal is formed around the periphery of the device 106.

Figure 11B:
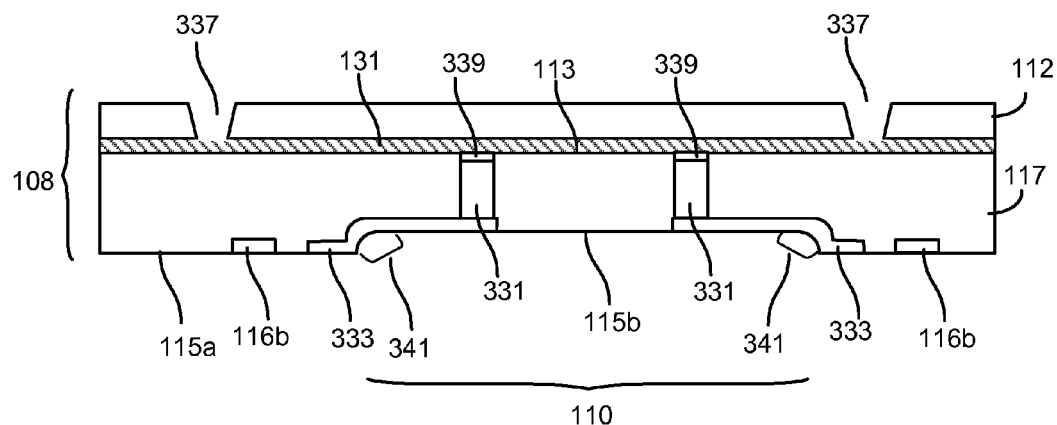

Returning to FIG. 10, the process 120 continues at block 124 with providing a cover glass releasably attached to a carrier substrate. The cover glass and the carrier substrate together may be referred to as a "cover plate." Implementations of methods of forming a cover plate are discussed further below with respect to FIG. 14-16J. In some implementations, forming a cover plate can include forming a sacrificial layer on a sacrificial substrate and then forming glass on the sacrificial layer, as will be described in further detail with reference to FIG. 14. FIG. 11B is an example of a cross-sectional illustration of a portion of a cover plate 108. The depicted portion includes one repeating unit of a cover plate 108 including cover glass 117 attached to carrier substrate 112. It should be noted that the geometry is not shown to scale with the illustration expanded the z-direction to show details of the cover glass 117. The carrier substrate can be any appropriate material, including glass or plastic, and can be transparent or non-transparent. In some implementations, carrier substrate 112 is significantly thicker than the cover glass 117 to facilitate handling. Example thicknesses of a carrier substrate 112 are between 300 and 1000 microns, for example, between 500 and 700 microns, while an example thickness provided for comparison of a cover glass 117 includes less than 100 microns, for example, about 50 microns.

In the example of FIG. 11B, cover plate 108 includes a removable layer 131. Removable layer 131 is disposed between cover glass 117 and carrier substrate 112. Removable layer 131 can include a removable bonding layer for bonding the cover glass 117 to the carrier substrate 112. Removable layer 131 can include a material that is removable from at least cover glass 117 upon exposure to chemical etchants, laser irradiation, electromagnetic irradiation, heat, mechanical force or other removal mechanism. Examples of removable layers include polymer adhesives, photoresists materials, thin metal layers and the like. Depending on the removal mechanism, the carrier substrate 112 can include one or more features configured to facilitate removal. In the example of FIG. 11B, carrier substrate 112 includes openings 337 to introduce a wet etchant. In some implementations, the carrier substrate can be transparent to allow exposure to laser or other irradiation. In some implementations, carrier substrate can be releasably attached to cover glass 117 without an intermediate removable layer.

Cover glass 117 includes a cavity 110 recessed from planar surface 115a configured to accommodate device 106 on device substrate 100, as well as a joining ring 116b that surrounds cavity 110. Joining ring 116b provides a point of attachment to the device substrate 100. Cover glass 117 also includes interconnects 331 configured to provide a conductive pathway from MEMS device 106, once the cover glass is joined to the device substrate, to exterior surface 113 of cover glass 117. In the example of FIG. 11B, interconnects 331 extend through cover glass 117 and include solderable material 339. Solderable material 339 is disposed on the ends of interconnects 331 at the exterior surface 113 of cover glass 117 and may be useful to facilitate connections to external components such as printed circuit boards (PCBs), application-specific integrated circuits (ASICs) and the like.

Cover glass 117 also includes routing 333 configured to electrically connect bond pads 114 of device substrate 100 and interconnects 331 of cover glass 117. In the example of FIG. 11B, routing 333 conformally extends from planar surface 115a of cover glass 117 to planar surface 115b of cavity 110, including rounded portion 341 conforming to a rounded portion of the interior surface of cover glass 117.

In the example of FIG. 11B, the depicted portion or unit of cover glass 117 is configured to encapsulate one device 106. The entire cover glass includes two or more units, each including routing and one or more interconnects, arrayed or otherwise appropriately arranged such that they can be aligned with two or more devices on a device substrate. In some implementations, a unit of the cover glass 117 may be configured to encapsulate more than one device, including MEMS devices and other devices.

Figure 11C:
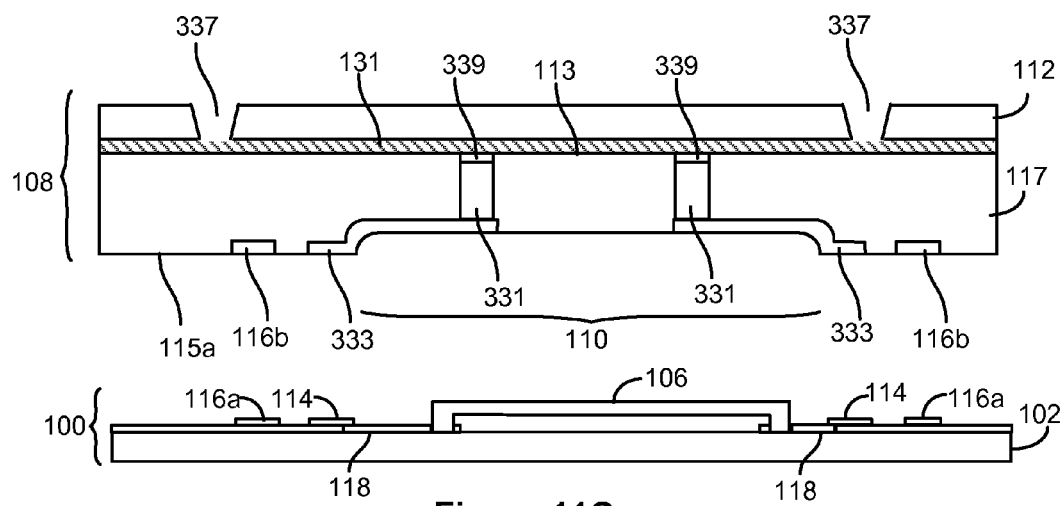

Returning to FIG. 10, the process 120 continues at block 126 with alignment of the cover plate and the device substrate. The cover plate and device substrate are aligned such that the cover glass is positioned over the device substrate. Aligning the cover plate and the device substrate can involve standard flip-chip placement techniques, including the use of alignment marks and the like. FIG. 11C is a cross-sectional illustration of alignment of cover plate 108 with device substrate 100. Cover plate 108 is positioned over device substrate 100 such that cavity 110 of cover glass 117 is disposed over MEMS device 106, joining ring 116b of cover glass 117 is aligned with joining ring 116a of device substrate 100, and bond pads 114 are aligned with a portion of routing 333 that extends from cavity 110 to outside cavity 110 on interior surface 115.

The process 120 continues at block 128 with joining the cover glass to the device substrate. Some or all devices on a device substrate can be simultaneously encapsulated in a joining operation. Methods of joining the cover glass to the device substrate include solder bonding, adhesive bonding, and thermocompression. Solder bonding involves contacting the joining ring of a device substrate to a solder paste or other solderable material in the presence of heat. In some implementations, a solder paste is applied to the joining rings on the device substrate and cover glass prior to joining. One type of solder bonding that can be used is eutectic metal bonding, which involves forming a eutectic alloy layer between the joining rings. Examples eutectic alloys that may be used include copper/tin (CuSn), gold/tin (AuSn), copper/tin/bismuth (CuSnBi), copper/tin/indium (CuSnIn), indium/bismuth (InBi), and silver/indium (AgIn). In some implementations, the joining rings are made of metals that form a eutectic alloy when joined. Adhesive bonding involves contacting the cover glass and the device substrate to an epoxy or other adhesive. Thermocompression bonding involves applying pressure and heat to join the joining rings in an absence of an intermediate material.

Joining process conditions such as temperature and pressure can vary according to the particular joining method and desired characteristics of the encapsulation area. For example, for eutectic or solder bonding, the joining temperature can range from about 100° C. to about 500° C. as appropriate. Example temperatures are about 150° C. for InBi eutectic, 225° C. for CuSn eutectic and 305° C. for AuSn.

For an adhesive bond, heat, radiation such as ultraviolet radiation or pressure may be applied to form an epoxy bond or other adhesive bond according to the desired implementation. In some implementations, a joining ring includes an epoxy or other polymer adhesive. The width of an epoxy joining ring is sufficient to provide an adequate seal and can vary according to the desired implementation. In some implementations, a width of an epoxy joining ring is between about 50 microns and 1000 microns. In some implementations, an epoxy joining ring having a width of about 500 microns or greater provides a quasi-hermetic seal. In some other implementations, an epoxy joining ring provides a non-hermetic seal. A thickness of an epoxy joining ring can range from about 1-500 microns thick. In some implementations, a UV-curable or heat curable epoxy is used. Examples of UV-curable epoxies include XNR5570 and XNR5516 epoxies from Nagase ChemteX Corp., Osaka, Japan. An epoxy or other polymer adhesive can be screen printed or otherwise dispensed on one or both of a cover glass or glass substrate prior to joining the cover glass to the glass substrate. An epoxy seal can be formed when the cover glass and the glass substrate are then brought into contact and the epoxy is cured.

In some implementations, the joining operation involves setting a defined pressure in the encapsulated area. This may involve pumping a gas in or out of a chamber in which the joining occurs to set the desired pressure. After the joining operation, the pressure in the encapsulated area to which the MEMS device is exposed can be below atmospheric, above atmospheric or at atmospheric pressure. The composition of the gas also can be tailored to a desired composition. For example, a desired inert gas composition and pressure to damp a proof mass of a MEMS accelerometer can be set during the joining process.

Figure 11D:
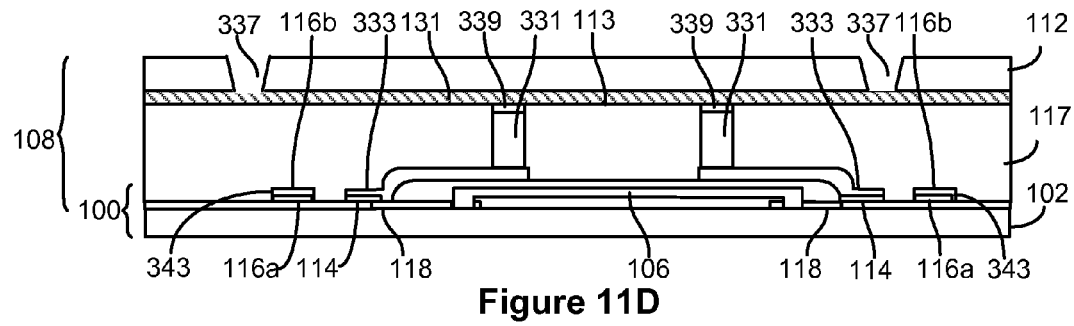

FIG. 11D is a cross-sectional illustration of cover plate 108 joined to device substrate 100. In the example of FIG. 11D, joining rings 116a and 116b of the device substrate 100 and cover glass 117, respectively, are joined by solder reflow to form a seal 343. Cover glass 117 encapsulates MEMS device 106. In some implementations, cover glass 117, along with glass substrate 102 and seal 343, isolates MEMS device 106 from the ambient environment. In some implementations, one or more access ports (not shown) in cover glass 117 and/or glass substrate 102 provide access to MEMS device 106. In some implementations, one or more breaks in seal 343 can provide access to MEMS device 106. Metal routing 118 of device substrate 100 contacts routing 333 of cover glass 117, thereby providing a conductive pathway from MEMS device 106 to interconnects 331.

Figure 11E:
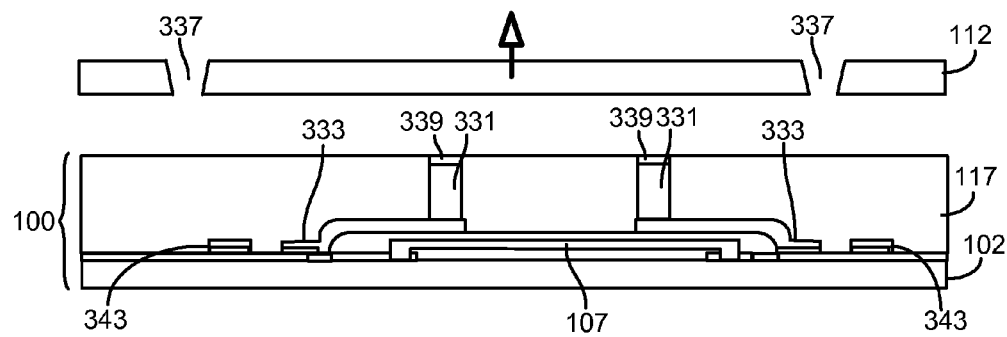
Figure 11F:
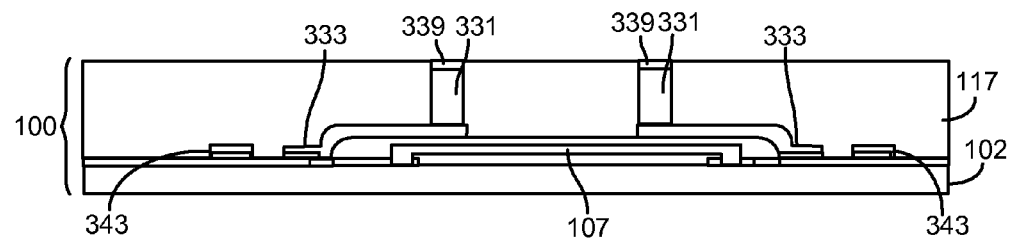

The process 120 continues at block 130 with release of the cover glass, now joined to the device substrate, from the carrier substrate. Releasing the cover glass can involve selectively etching or otherwise removing a removable layer that attaches the cover glass to the carrier substrate. FIG. 11E is a cross-sectional illustration of release of carrier substrate 112 from cover glass 117. Removable layer 131, depicted in FIGS. 11B-11D, is no longer present, having been etched by an etchant introduced via openings 337. Carrier substrate 112 can be attached to another cover glass for joining to another device substrate or discarded according to the desired implementation. FIG. 11F is a cross-sectional schematic of the encapsulated MEMS device 107. Device substrate 100, including encapsulated MEMS device 107, is ready for further processing operations with interconnects 331 providing a point for electrical connection to the device 107. As indicated above, in some implementations an encapsulation process as described with reference to FIGS. 10 and 11A-11F is a batch level process in which all or at least a plurality of devices on a device substrate are encapsulated as a batch prior to singulation. In other implementations, the encapsulation process can be performed to encapsulate an individual device. The distance from the edge of the device substrate 100 to the seal 343 can vary according to the desired implementation. Prior to singulation, if performed, the distance is large enough to accommodate a dicing line. In some implementations, little glass is left outside of the seal 343 after singulation, though it can be useful to avoid nicking the seal 343 during singulation by providing some tolerance.

Figure 12:
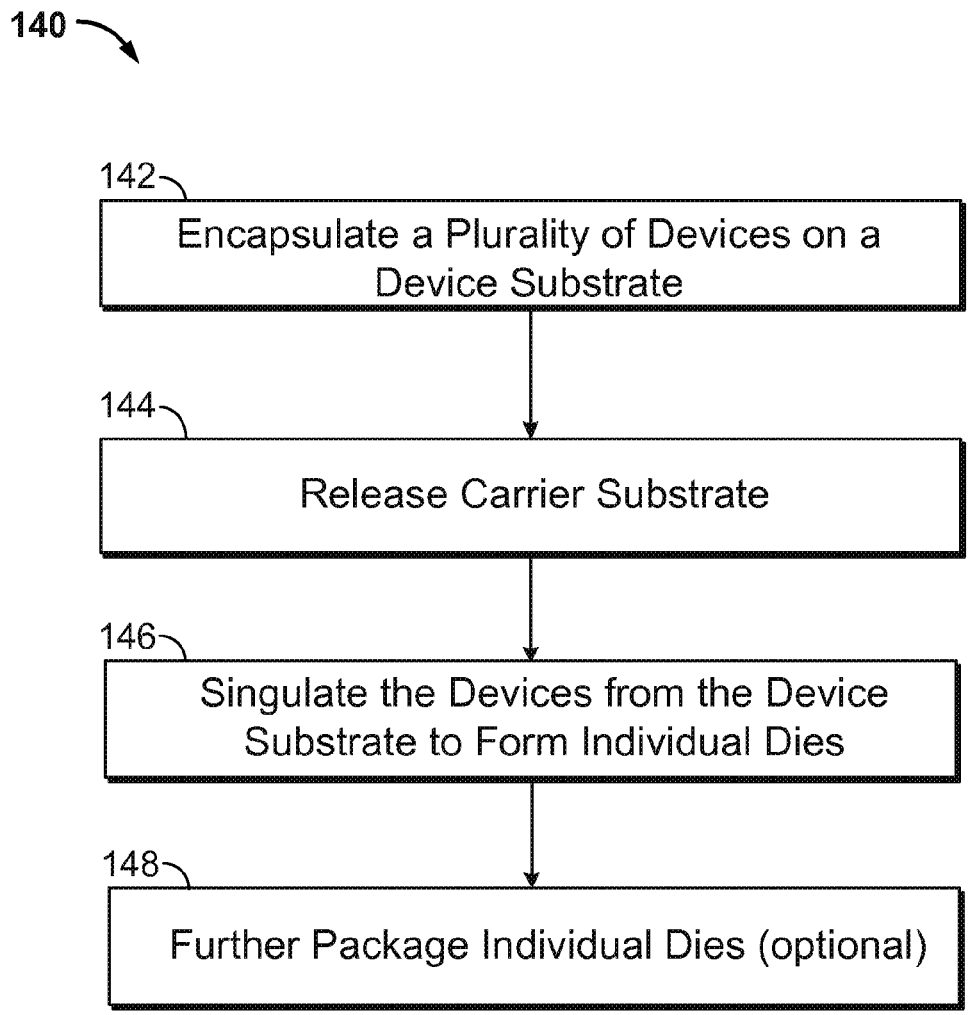
FIG. 12 shows an example of a flow diagram illustrating a process for fabricating individual dies using a batch level encapsulation process.
Figure 13A:
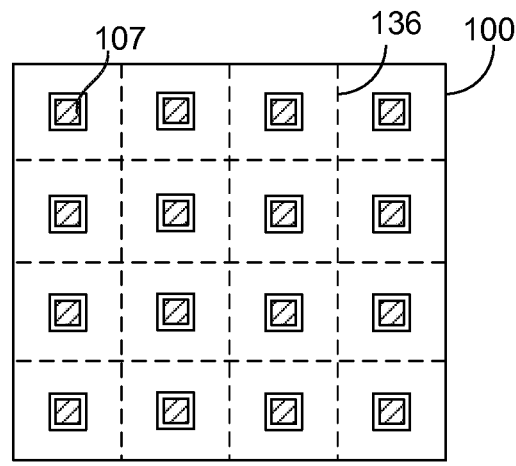
FIGS. 13A and 13B show examples of schematic illustrations of various stages of a batch level process of fabricating individual dies including encapsulated devices.
Figure 13B:
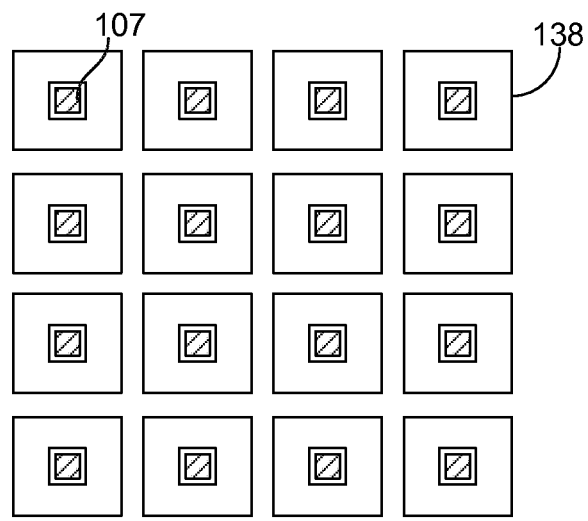

FIG. 12 shows an example of a flow diagram illustrating a process for fabricating individual dies using a batch level encapsulation process. FIGS. 13A and 13B show examples of schematic illustrations of various stages of a batch level process of fabricating individual dies including encapsulated devices. In FIG. 12, a process 140 begins at block 142 with the encapsulation of a plurality of devices on a device substrate. In some implementations, encapsulating a device of a device substrate includes one or more blocks of process 120 discussed above with reference to FIGS. 10 and 11A-11F. Process 140 continues at block 144 with releasing a carrier substrate, which is discussed above with reference to block 130 of FIG. 10, and further below. The process 140 continues at block 146 by singulating the devices from the device substrate to form individual dies, each die including an encapsulated device. FIG. 13A is a plan schematic depiction of a device substrate 100 prior to singulation. Device substrate 100 includes encapsulated devices 107, which are arrayed on the device substrate 100. A cover glass (not shown) covers encapsulated devices 107 and includes interconnects as described above. Dicing lines 136 indicate the desired cut locations. FIG. 13B is a plan schematic depiction of singulated individual dies 138, each die including an encapsulated device 107. In some implementations, the cut through the dicing lines 136 is about 200 microns to 300 microns wide.

Returning to FIG. 12, the process 140 can continue in block 148 with further packaging the individual dies. Further packaging an individual die can include forming an electrical connection to the interconnects 331 of a cover glass 117 (see FIG. 11E), which in turn provides an electrical connection to the encapsulated MEMS device 107, attaching the die to an integration substrate, and covering the die with an overmold material. Forming an electrical connection can involve techniques such as wire bonding and flip-chip attachment using solder balls. In some implementations, the die is attached to an integration substrate, such as printed circuit board (PCB), along with an application specific integrated circuit (ASIC).

Further details of implementations of certain operations of the process flows described in FIGS. 10 and 12 are given below. As indicated above, some implementations include providing a device substrate. The device substrate includes one or more devices disposed on a substrate and can include associated components such as bond pads, metal traces and the like. One example of a device substrate is described above with reference to FIG. 11A. In some implementations, the device substrate includes a joining ring surrounding a device, and at which a cover glass can be joined to the device substrate. The material or materials that form the joining ring can vary according to method of joining and the desired implementation. For example, in some implementations, the joining ring can include a solderable metallurgy. Examples of solderable metallurgies include nickel/gold (Ni/Au) bilayers, nickel/palladium (Ni/Pd) bilayers, nickel/palladium/gold (Ni/Pd/Au) trilayers, copper (Cu), and gold (Au). In some implementations, the joining ring has a different metallization than that of a removable layer used in fabricating the cover plate. For example, if a Cu-based removable layer is employed, the joining ring is not Cu-based in some implementations. This is to preserve etch selectivity of the removable layer with respect to the joining ring. In some implementations, the joining ring has the same metallization as a corresponding joining ring on the cover glass. In some implementations, the joining ring includes an epoxy or polymer adhesive material in addition or instead of a metal.

The joining ring may be shaped in any appropriate manner and is generally shaped and sized to correspond to a joining ring on the cover glass to which it is configured to be joined. Examples of joining ring shapes include circles, ovals, squares, rectangles, rectangles with rounded corners, etc. In some implementations, a joining ring is formed such that it completely surrounds a device. In various implementations, the joining ring can be unbroken or can include breaks.

The width of the joining ring is sufficient to provide an adequate seal and can vary according to method of joining and the desired implementation. The seal can be hermetic or non-hermetic according to the desired implementation. In some implementations, the width is less than 1 millimeter. In some implementations in which solder or eutectic joining is performed, it is possible to provide adequate seals with widths less than about 200 microns. In some implementations, the width of a joining ring is larger than the desired width of the seal to accommodate CTE mismatch between a device substrate and a cover glass during the joining process. In some implementations, a device substrate does not include a joining ring prior to encapsulation. For example, an epoxy may be applied to the cover glass only without applying any epoxy to the device substrate prior to joining.

In some implementations, the device substrate 100 includes bond pads 114 and conductive routing 118 for connection to interconnects 331 in a cover glass 117. Bond pads and conductive routing may include any appropriate electrically conductive materials. Examples of appropriate materials include Ni, Ni/Au bilayers, Ni/Pd bilayers, Ni/Pd/Au trilayers, Cu and Au. As with the joining ring, the metallization of bond pads and conductive routing can be different than that used for a removable layer of a cover plate, if any. In some implementations, the bond pads, conductive routing and joining ring can be the same metal and can be formed in the same metallization process. Formation of the joining ring, bond pads, conductive routing and other components of the device substrate can occur as part of the MEMS fabrication process, or prior to or after the MEMS fabrication process.

Figure 14:
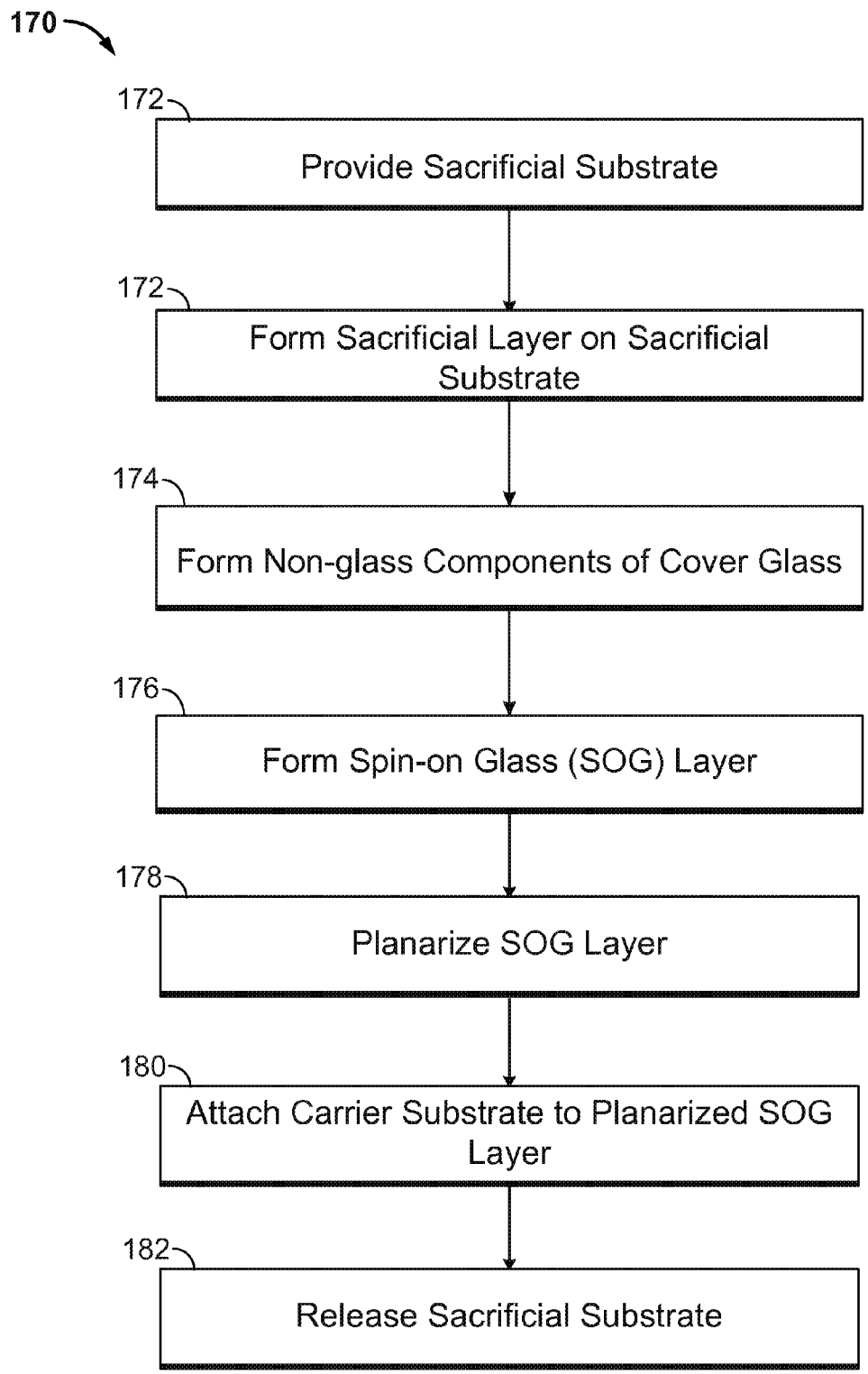
FIG. 14 shows an example of a flow diagram illustrating a process for forming a cover plate.

FIG. 14 shows an example of a flow diagram illustrating a process for forming a cover plate. An overview of a process according to some implementations is given in FIG. 14, with examples of specific implementations described further below with reference to FIGS. 15A-16J. The process 170 begins at block 172 with providing a sacrificial substrate. The sacrificial substrate is a substrate on which a sacrificial material is formed to define surface features of the cover glass. The sacrificial substrate can be glass, plastic, silicon or other appropriate material and have a thickness of about 300-1000 microns, for example. As described below, the cover glass is formed on the sacrificial substrate. Accordingly, the area of the sacrificial substrate is typically at least as large as the desired area of the cover glass. For example, in some implementations, a sacrificial substrate such as a glass plate or panel having an area on the order of four square meters or greater is provided with a thickness, for example, of 300 microns, 500 microns or 700 microns. Alternatively, round substrates with diameters of 100 millimeters, 150 millimeters, or other diameters may be provided. In some implementations, square or rectangular sub-panels cut from a larger panel of glass or other substrate material may be provided as a sacrificial substrate. In some implementations, the sacrificial substrate is provided in a roll of a flexible polymeric or other flexible material. For example, the sacrificial substrate can be provided in a continuous roll of material as part of a roll-to-roll process of forming a cover glass. Other substrate materials and thicknesses can be used, including any substrate on which a sacrificial material can be formed.

The process 170 continues at block 172 with formation of a sacrificial layer on the sacrificial substrate. The sacrificial layer can function as a mold on which the cover glass is formed and includes topological features shaped to define cavities and/or other desired features of the cover glass. In some implementations, the sacrificial layer coats the surface of the sacrificial substrate on which the cover glass is formed, such that removal of the sacrificial layer releases the sacrificial substrate from the cover glass. Examples of sacrificial materials that can be used to form the sacrificial layer include metals, semiconductors, and acrylics. For example, the sacrificial material can be a material removable by a wet or dry etching such as copper, molybdenum, aluminum, and amorphous silicon may be used. In another example, the sacrificial material can be a material removable by exposure to radiation or thermal treatment such as a UV-removable acrylic. In some implementations, the sacrificial layer can be formed from a combination of different sacrificial materials. For example, a first sacrificial material can be used to coat a surface of the sacrificial substrate with a second sacrificial material used to form topological features according to the desired implementation.

In some implementations, the sacrificial layer includes raised features arranged to mold cavities in a cover glass as described above with respect to FIGS. 9 and 11B. In some implementations, the sacrificial layer is substantially planar without raised features. For example, if devices on a device a substrate are disposed within cavities on the device substrate, a cover glass configured to encapsulate these devices may have a substantially planar interior surface, without cavities formed therein. Accordingly, a sacrificial layer used to mold the cover glass can be substantially planar.

The process 170 continues at block 174 with formation of non-glass components of the cover glass. Non-glass components of the cover glass can include conductive interconnects, routing, a joining ring, and the like according to the desired implementation. In some implementations, metal interconnects are plated. The interconnects can be posts, pillars, or other features that extend from the sacrificial material, and can eventually extend from opposing surfaces of the cover glass once the cover glass is formed. Interconnect placement can vary according to the desired implementation. For example, in some implementations, an interconnect is disposed over a raised feature of the sacrificial layer such that it will be over a recessed feature of the subsequently formed cover glass once the sacrificial layer is removed. In another example, an interconnect is disposed adjacent to a raised feature of the sacrificial layer such that it will be adjacent to a recessed feature of the subsequently formed cover glass once the sacrificial layer is removed. In some implementations, metal routing and/or a joining ring is formed prior to, during or after formation of the metal interconnects. In some implementations, various non-glass components of the cover glass may be formed during or after subsequent blocks of the process 170. Blocks 172 and 174 can include various aspects of process 230 discussed further below with reference to FIG. 15A.

The process 170 continues at block 176 with formation of a spin-on dielectric, for example a spin-on glass (SOG) layer. Spin-on dielectric refers to any solid dielectric deposited by a spin-on deposition process, which also may be referred to as a spin coating process. In a spin-on deposition process, a liquid solution containing dielectric precursors in a solvent is dispensed on the sacrificial layer. The sacrificial substrate may be rotated while or after the solution is dispensed to facilitate uniform distribution of the liquid solution during rotation by centrifugal forces. Rotation speeds of up to 6000 rpm may be used. In some implementations, for example for large panel processes, the spin-on glass can be dispensed with an extrusion mechanism using a blade type nozzle, with no subsequent spinning. The dispensed solution can then be subjected to one or more post-dispensation operations to remove the solvent and form the solid dielectric layer. In some implementations, the dielectric precursor is polymerized during a post-dispensation operation. The spin-on dielectric layer can be an organic or inorganic dielectric layer according to the dielectric precursor used and the desired implementation. In some implementations, multiple layers can be dispensed and cured to build up the spin-on dielectric layer. In implementations where the device substrate discussed above is glass, it can be useful to use a dielectric that, once solidified, has a CTE that is matched with the CTE of the glass device substrate. Hence, in some implementations, the spin-on dielectric is a SOG layer. The following discussion will focus on implementations using SOG layers, although it is understood that other dielectric layers are possible.

Examples of dielectric precursors include doped or undoped silicates, siloxanes, and silsesquioxanes. Examples of dopants, if used, include boron and phosphorous. Examples of solvents include water and alcohols such as ethanol or isoproponal, or combinations thereof. Liquid solutions may be fabricated or obtained commercially. The dispensed liquid covers and conforms to the topology of the underlying sacrificial layer and non-glass components well, without significant voids. The top surface of the dispensed liquid can be substantially planar.

In some implementations, a post-dispensation operation includes a thermal anneal at a temperature of between about 100° C. to 450° C. In some implementations, a single dispensation operation can performed to form the SOG layer. In some implementations, multiple dispensation/post-dispensation operation cycles can be performed to form the SOG layer. The SOG layer can be dispensed to a thickness greater than the desired thickness of the cover glass to accommodate shrinkage during anneal and subsequent planarization. Target cover glass thicknesses can range from about 30 microns to about 200 microns. In some implementations, a target cover glass thickness is between about 50 microns and 150 microns. The SOG layer may cover interconnects or other non-glass components formed in operation 174.

The process 170 continues at block 178 with planarization of the SOG layer. In some implementations, after formation, the surface of the SOG layer may include bumps over the raised features of the sacrificial layer, interconnects or other components of formed on the sacrificial layer. The SOG layer can be planarized such that surfaces of the interconnects are exposed and accessible for electrical connection. Planarizing the SOG layer can include one or more operations including lapping, grinding, chemical mechanical planarization (CMP), an anisotropic dry etch, or another appropriate method.

The process 170 continues at a block 180 with attachment of a carrier substrate to the planarized SOG layer. The carrier substrate can be attached to the planarized SOG layer using a removable layer. Examples of removable layers include photoresist material removable by exposure to the appropriate developer chemistry and laser-cleavable polymers.

The process 170 continues at block 182 with release of the sacrificial substrate. Releasing the sacrificial substrate can occur by etching or otherwise removing the sacrificial layer. In some implementations, once the sacrificial substrate is released, the cover plate, including a cover glass releasably attached to a carrier substrate, is fabricated and ready for alignment with a device substrate. The sacrificial substrate can be reused or discarded according to the desired implementation. Blocks 176-182 can include various aspects of process 230 discussed further below with reference to FIG. 15B.

Figure 15A:
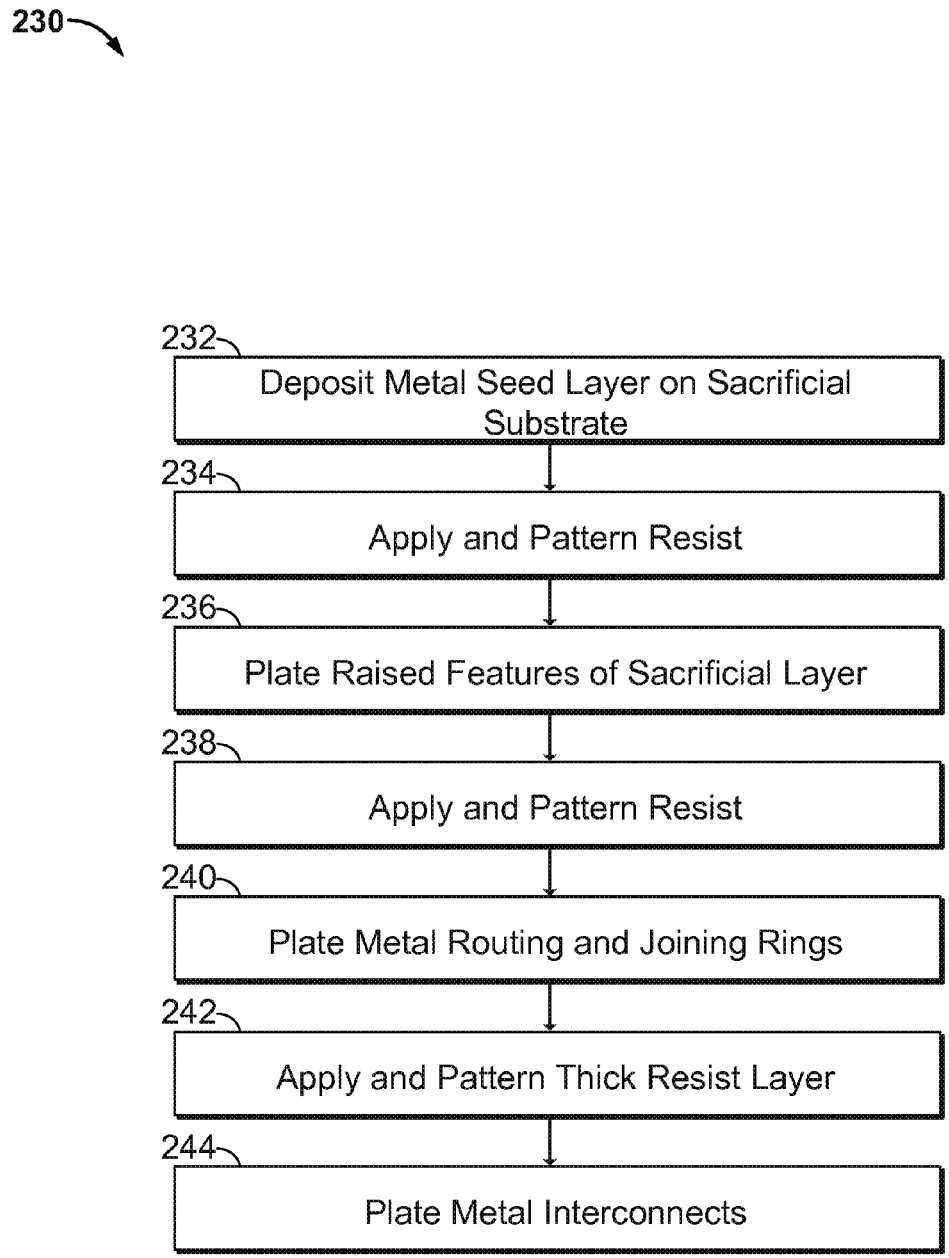
FIGS. 15A and 15B show examples of flow diagrams illustrating a process for forming a cover plate.
Figure 15B:
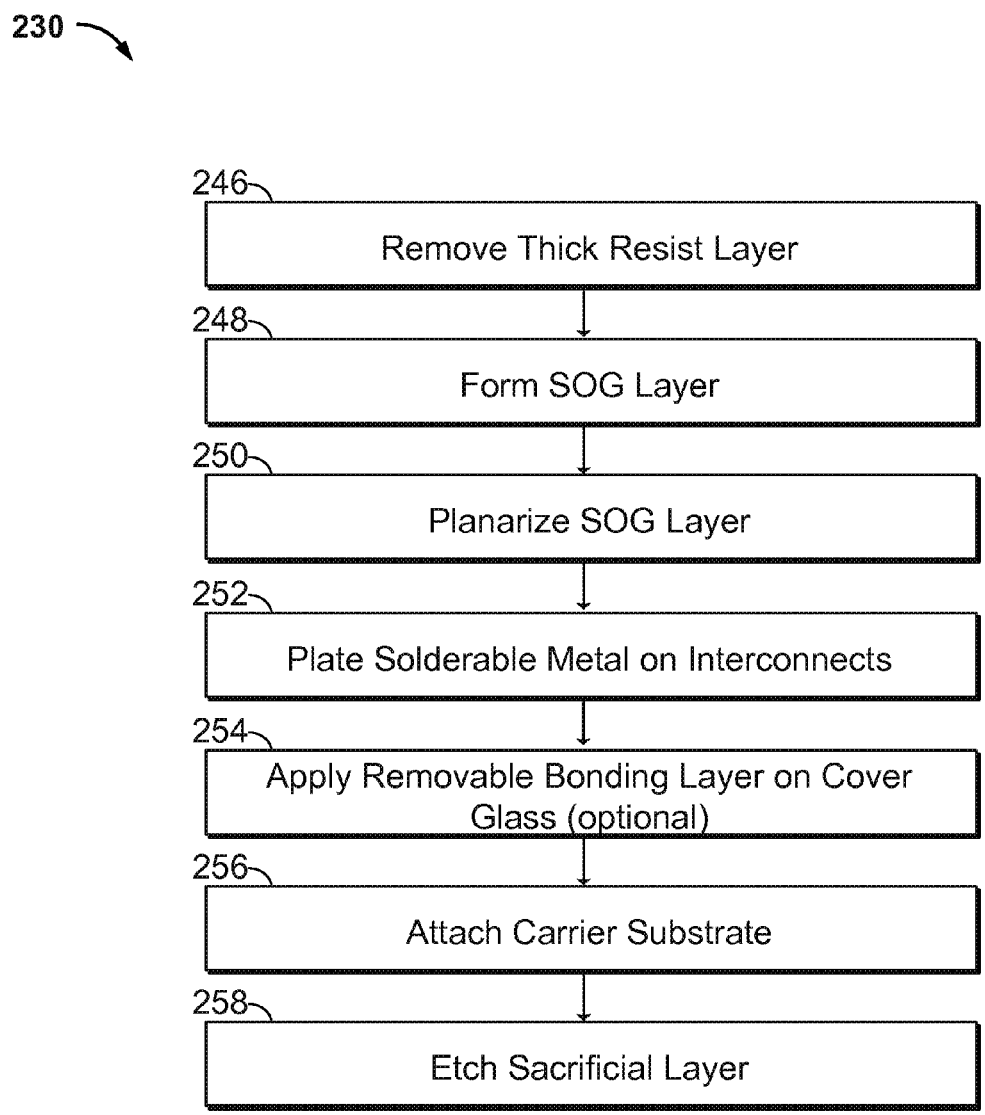

Specific implementations of processes for forming cover plates are discussed below with reference to FIGS. 15A, 15B and 16A-16J. FIGS. 15A and 15B show examples of flow diagrams illustrating a process for forming a cover plate. FIG. 15A shows an example of a flow diagram illustrating certain operations in performing blocks 172 and 174 of FIG. 14. FIG. 15B shows an example of a flow diagram illustrating certain operations in performing blocks 176-182 of FIG. 14. FIGS. 16A-16J show examples of cross-sectional schematic illustrations of various stages in a method of forming a cover plate.

First turning to FIG. 15A, a process 230 begins at block 232 with depositing a metal seed layer on a sacrificial substrate. The sacrificial substrate can be any appropriate area and shape. In some implementations, the sacrificial substrate is approximately the same area and shape as a device substrate on which the devices to be encapsulated are disposed. In some implementations, the sacrificial substrate can have a thickness of about 300-1000 microns, for example. The sacrificial substrate includes a surface on which a sacrificial layer is formed in one or more subsequent operations. The sacrificial substrate can be glass, plastic, silicon or other material on which a metal sacrificial layer can be plated.

The metal seed layer provides a conductive substrate on which a metal layer can be plated. In the example of FIG. 15A, the metal seed layer acts as a part of the sacrificial layer as well as a seed layer for subsequent plating of raised features of the sacrificial layer. The surface on which the metal seed layer is deposited can be planar or include raised or recessed features according to the desired implementation. The metal seed layer is generally conformal to the underlying sacrificial substrate surface. Examples of metals include copper (Cu), aluminum (Al), gold (Au), niobium (Nb), chromium (Cr), tantalum (Ta), nickel (Ni), tungsten (W), titanium (Ti) and silver (Ag). In some implementations, an adhesion layer is conformally deposited on a surface of the sacrificial substrate prior to deposition of the metal seed layer. For example, for a copper (Cu) seed layer, examples of adhesion layers include chromium (Cr) and titanium (Ti). The adhesion layer and seed layer may be deposited by sputter deposition though other conformal deposition processes, including atomic layer deposition (ALD), evaporation and other chemical vapor deposition (CVD) or physical vapor deposition (PVD) processes may be used. Example thicknesses of the adhesion layer range from about 100 Angstroms (Å) to about 500 Å, or more particularly from about 150 Å to 300 Å, though the adhesion layer can be thinner or thicker according to the implementation. Example seed layer thicknesses range from 800 Å to 10,000 Å, or more particularly from about 1,000 Å to about 5,000 Å, though the metal seed layer can be thinner or thicker according to the desired implementation. In one example, a Cr adhesion layer having a thickness of 150 Å and a Cu seed layer having a thickness of 1,000 Å is deposited.

Figure 16A:
FIGS. 16A-16J show examples of cross-sectional schematic illustrations of various stages in a method of forming a cover plate.

FIG. 16A is an example of a cross-sectional illustration of a portion of a sacrificial substrate having a metal seed layer deposited thereon. (It should be noted that the geometry is not shown to scale with the illustration expanded the z-direction to show details.) In the example of FIG. 16A, a metal seed layer 402 is deposited across a planar surface of sacrificial substrate 406.

The process 230 continues at block 234 with application and patterning of a resist. The resist is applied on the metal seed layer surface and patterned to define the areas which will be plated to form raised features of the sacrificial layer. Any appropriate resist can be used including dry film, liquid and epoxy-based resists. The resist can be patterned by techniques including masked exposure to radiation and chemical development.

The process 230 continues at block 236 with plating raised features of the sacrificial layer. As described above, the sacrificial layer includes raised features arranged and shaped to define cavities of the cover glass that are formed when the sacrificial layer is removed. The raised features can be plated using electroless plating or electroplating as appropriate for the material used in the particular implementation. Any appropriate metal material may be used. As discussed below with reference to operation 240, in some implementations the sacrificial layer has a different metallization than that used for metal interconnects and other metal components of the cover glass. This is to preserve etch selectivity of the sacrificial layer with respect to these components.

In some implementations, Cu or a Cu alloy is used. As the sacrificial layer includes raised features that will eventually define the cavities of the cover glass that accommodate the devices on a device substrate, the thickness or height of the raised features is sufficient to provide clearance for devices. In some implementations, the raised features are about 10-20 microns above the surface of the seed layer, though they may be thinner or thicker according to the desired implementation. The area of the raised feature varies according to the size of the MEMS devices to be encapsulated and can be arbitrarily large. In some implementations, an area is between about 1 square micron to about 100 square millimeters. In some implementations, a Cu plating bath can contain one or more additives to facilitate the formation of slightly rounded features.

In an operation not depicted in FIG. 15A, the resist is stripped by a technique appropriate for the resist, with post-strip cleans of resist-related residue performed according to the desired implementation.

Figure 16B:
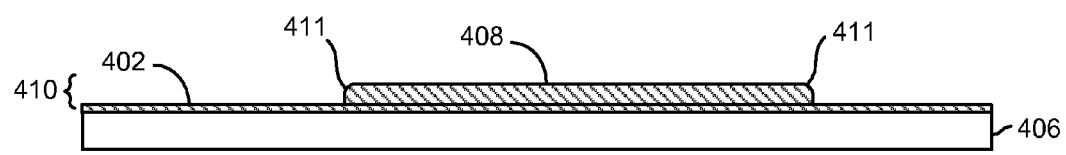

FIG. 16B is an example of a cross-sectional illustration of a sacrificial layer formed on a portion of a sacrificial substrate. In the example of FIG. 16B, sacrificial layer 410 includes seed layer 402 and raised feature 408 on a surface of sacrificial substrate 406. Raised feature 408 includes rounded edges 411.

The process 230 continues at block 238 with application and patterning of a resist. The resist is applied on the sacrificial layer surface and is patterned to define the areas that will be plated to form the routing and joining ring of the cover glass. Any appropriate resist can be used including dry film, liquid and epoxy-based resists. In some implementations, an electrophoretic resist (EPR) is used. EPRs are able to be conformally deposited on raised features where spin-coating resist can be difficult. Accordingly, an EPR can be useful in implementations in which conductive routing conformal to the raised features formed in block 236 is desired. An EPR can be applied by electrodeposition with a potential applied across the sacrificial layer and a counter electrode, followed by rinsing and baking. An example of an EPR is Chemical Eagle 2100 ED available from Dow Chemical. Patterning the resist can involve masked exposure and development operations according to the desired implementation. In some implementations, electrophoretic resist is patterned to form multiple lines, with resist line widths between about 10 microns and 100 microns and with resist line spacing between about 10 microns and 100 microns according to the desired implementation.

In the example of FIG. 15A, the EPR or other resist is used as a plating mask, though in some other implementations, in can be used as an etch mask to etch a previously plated metal layer.

The process 230 continues at block 240 with plating the metal routing and joining ring of the cover glass. Any metal that can be plated can be used with electroless plating or electroplating as appropriate for the material used in the particular implementation can be used. As indicated above, in some implementations, the routing and joining ring are plated using a different metal than used for the sacrificial layer. For example, Ni or a Ni alloy can be used to plate the metal routing and joining ring on a Cu-based sacrificial layer. Examples of Ni alloys include nickel cobalt (NiCo), nickel iron (NiFe) and nickel manganese (NiMn). In addition to Ni, materials that can be used include palladium (Pd), palladium (Pd) alloys, copper (Cu), copper (Cu) alloys, gold (Au), gold alloys (Au), aluminum (Al), aluminum (Al) alloys, tin (Sn), tin (Sn) alloys, titanium (Ti) and titanium (Ti) alloys or combinations thereof.

In some implementations, a bilayer is plated, with a small thickness of a first metal conducive to soldering or other connecting processes plated first, followed by a main metal layer. Examples of metals conducive to soldering include gold Au and Pd. For example, in some implementations, an Au/Ni bilayer is plated, with Au plated to facilitate joining the cover glass to the device substrate in subsequent processing. The joining ring and metal routing can be plated to any appropriate thickness, for example, to about 5-10 microns. In an operation not depicted in FIG. 15A, the resist is then stripped by a technique appropriate for the resist, with post-strip cleans of resist-related residue performed according to the desired implementation.

Figure 16C:
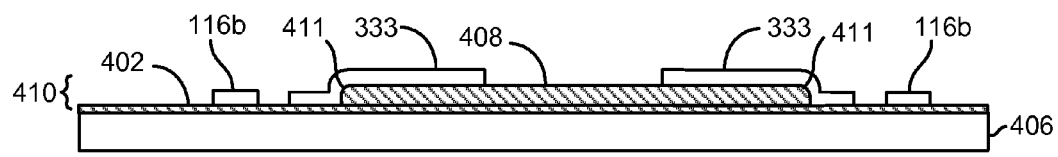

FIG. 16C is an example of a cross-sectional illustration of a joining ring and metal routing of a portion of a cover glass formed on a sacrificial layer. In the example of FIG. 16C, joining ring 116b is formed on seed layer 402 of sacrificial layer 410, with routing 333 formed on seed layer 402 and on raised feature 408 of sacrificial layer 410. Routing 333 extends conformally over rounded portion 411 of raised feature 408.

The process 230 continues at block 242 with application and patterning of a thick resist layer. The resist is applied to the desired thickness of the glass cover. In some implementations, the resist is thick enough to form an interconnect through the cover glass. In some implementations, the thickness is between about 30 and 250 microns. The thick resist layer is patterned to define the areas that will be plated to form metal interconnects. The resist includes any suitable resist that can be applied and patterned at the desired thickness, can be stripped easily, and can withstand a plating bath. Examples of thick resists include AZ® 4562 and AZ® 9260 resists available from AZ Electronics Materials in Branchburg, N.J., DuPont WBR2000™ Series resists, and SU-8 and KMPR resists from MicroChem in Newton, Mass.

Figure 16D:
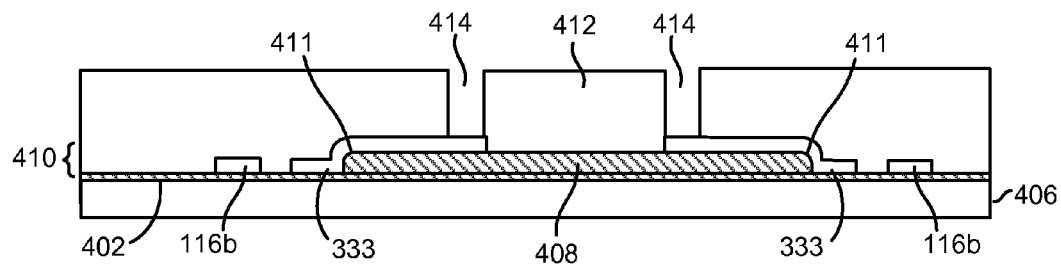

FIG. 16D is an example of a cross-sectional illustration of a resist on a sacrificial substrate patterned to define areas that will be plated to form metal interconnects. In the example of FIG. 16D, thick resist layer 412 is patterned to define patterned areas 414 that will be plated to form metal interconnects. The patterned areas 414 are disposed over routing 333 to expose routing 333 such that the plated interconnects will be in contact and electrical communication with routing 333. In some implementations, the interconnects are cylinders having diameters of between about 30 microns and 100 microns. In some implementations, the interconnects are non-cylindrical posts having cross-sectional dimensions of between 30 and 100 microns.

Figure 16E:
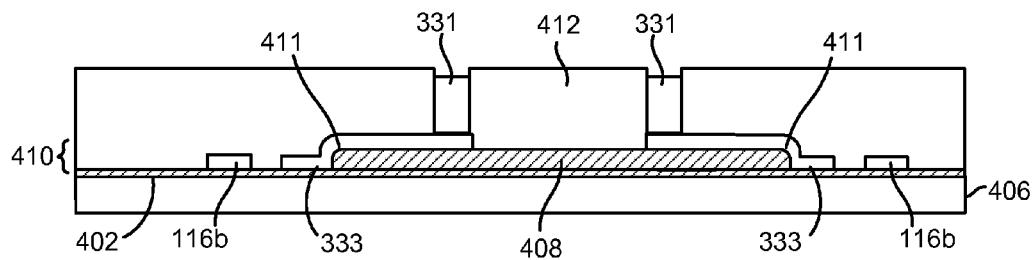

The process 230 continues at block 244 with plating metal interconnects. Electroless plating or electroplating as appropriate for the material used in the particular implementation can be used. As indicated above, in some implementations, the routing and joining ring are plated using a different metal than used for the sacrificial layer. In some implementations, the same metallization employed for the metal routing is used. For example, Ni or a Ni alloy can be used to plate the metal interconnects, routing and joining ring on a Cu-based sacrificial layer. Examples of Ni alloys include nickel cobalt (NiCo), nickel iron (NiFe) and nickel manganese (NiMn). In addition to Ni, materials that can be used include Pd and Pd alloys. The metal interconnects can be plated up to the upper surface of the deposited resist layer. FIG. 16E is an example of a cross-sectional illustration of a sacrificial substrate 406 including plated interconnects 331 in a thick resist layer 412.

While FIG. 15A shows an example of a process in which a resist is used as a plating mask, in some implementations, a resist can be used as an etch mask. For example, a blanket Al or Al alloy layer can be deposited on a sacrificial layer. A patterned photoresist layer can then be used as an etch mask to etch the Al or Al alloy layer to create Al metallization including interconnects. The Al metallization can be further metallized with Ni/Pd/Au trilayers or Ni/Au bilayers through electroless deposition.

Figure 16F:
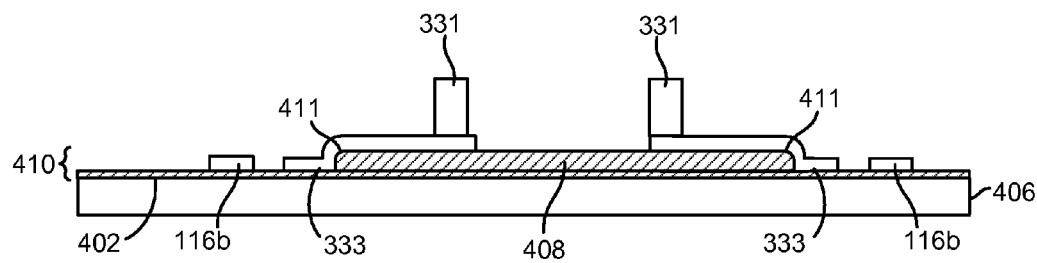

With reference now to FIG. 15B, the process 230 continues at block 246 with removal of the thick layer of resist. FIG. 16F is an example of a cross-sectional illustration of an example of a joining ring 116b, routing 333 and interconnects 331 formed on a sacrificial layer 410, including seed layer 402 and raised feature 408, after removal of a thick resist. In some implementations, all or most of the non-glass components of the cover glass are formed by this point in the process.

The process 230 continues at block 248 with formation of a spin-on glass (SOG) layer. As described above, a SOG layer can be formed by first applying a liquid solution containing dielectric precursors in a solvent on the sacrificial layer. The applied solution can then be subjected one or more operations to remove the solvent and form a solid dielectric layer. On application, the liquid solution flows over and around the joining ring, metal routing and metal interconnects such that they are embedded within the cover glass.

Figure 16G:
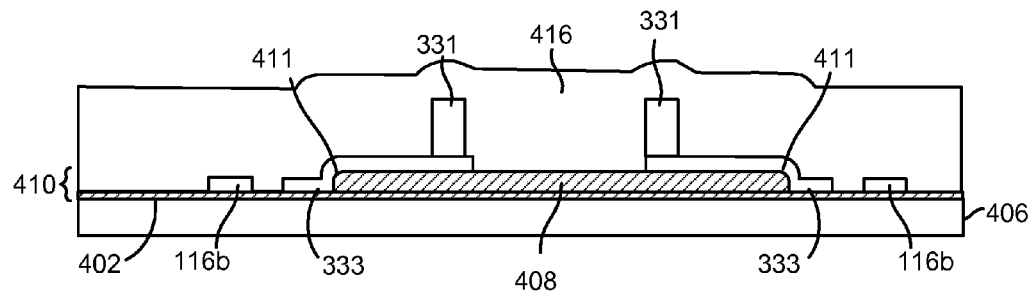

FIG. 16G is an example of a cross-sectional illustration of an example of an SOG layer 416 formed on sacrificial layer 410. In the example of FIG. 16G, SOG layer 416 covers joining ring 116b, routing 333 and interconnects 331. Turning to FIG. 15B, the process 230 continues at block 250 with planarization of the SOG layer. Any appropriate planarization process such as CMP, grinding, lapping or buffing may be used. The SOG layer is planarized to expose metal interconnect surfaces. The process 230 then continues at block 252 with plating a solderable metal on the exposed surfaces of the metal interconnect. Examples of solderable metallurgies include Ni/Au bilayers, nickel/palladium Ni/Pd bilayers, Ni/Pd/Au trilayers, Cu, and Au. The thickness of the plated solderable metal can be between about 0.5 microns and 2 microns in some implementations. In one example, a Ni/Au bilayer is plated having a thickness of about 1 micron Ni/0.3 microns Au.

Figure 16H:
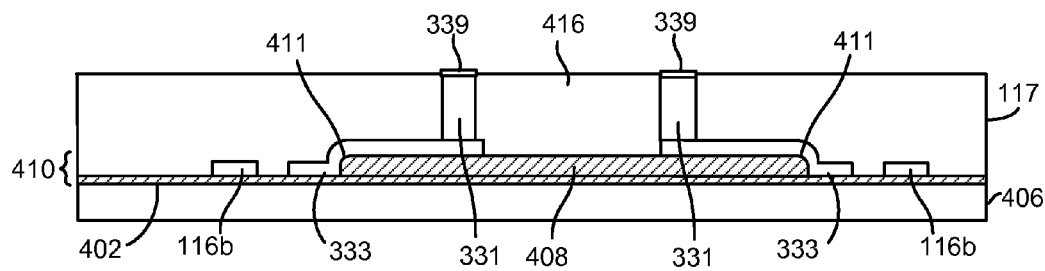

In some implementations, the cover glass is formed after planarization and plating of solderable material, and is ready for attachment to a carrier substrate. FIG. 16H is an example of a cross-sectional illustration of a cover glass 117, including SOG layer 416, now planarized, interconnects 331 including solderable material 339, routing 333, and joining ring 116b. In the example of FIG. 16H, cover glass 117 is attached by sacrificial layer 410 to sacrificial substrate 406.

The process 230 continues at block 254 with applying removable bonding layer on the planarized surface of the cover glass or a surface of a carrier substrate. Examples of removable bonding layers, in addition to those mentioned above, include benzo-cyclo-butene (BCB) available from Dow Chemical and DuPont HD7010. The process 230 continues at block 256 with attachment of the carrier substrate using the removable bonding layer disposed between the cover glass and carrier substrate. Bonding can involve application of thermal, electromagnetic and mechanical energy according to the characteristics of the removable layer and the desired implementation. In some implementations, the removable layer is a resist material such as laminate photoresist material removable by exposure to the appropriate developer chemistry. In some implementations, the removable bonding layer can be etched but should be selectively etchable relative to the sacrificial layer.

Figure 16I:
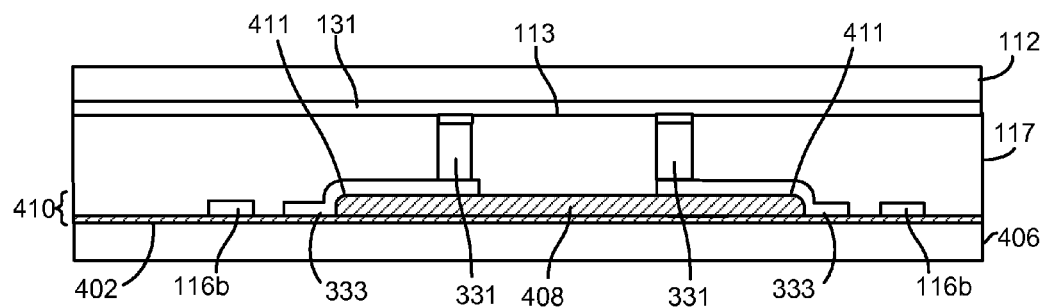

FIG. 16I is an example of a cross-sectional illustration of a carrier substrate 112 attached to the exterior surface 113 of cover glass 117 by removable layer 131. In the example of FIG. 16I, removable layer 131 is removable by laser irradiation through a laser-transparent carrier substrate 112. After attachment of the carrier substrate, the process 230 continues at block 258 with an etch of the sacrificial layer. Etching the sacrificial layer releases the sacrificial substrate from the cover glass as well as forming cavities configured to cover devices on a device substrate when the cover glass is joined to the device substrate.

Etching the exposed sacrificial layer is performed with an etchant that is selective to the sacrificial layer, without etching the metal joining ring, interconnects and other components of the cover glass. Selective etchants include etchants that have selectivity of at least about 100:1 or higher for the sacrificial layer. Specific examples of etchants for selective etching of copper layers include a mixture of acetic acid ($CH_3CO_2H$) and hydrogen peroxide ($H_2O_2$), and ammoniacal-based etchant such as BTP copper etchant from Transene Company, Inc. in Danvers, Mass.

Figure 16J:
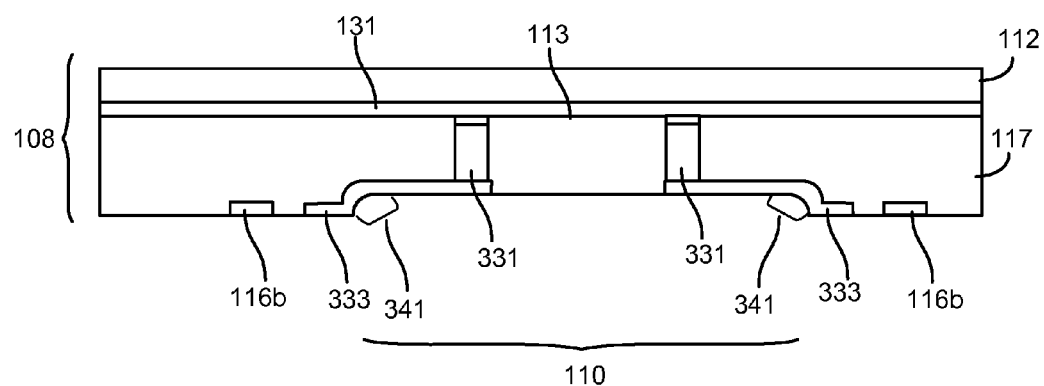

FIG. 16J is an example of a cross-sectional illustration of a cover plate 108, including cover glass 117 and carrier substrate 112. Cover glass 117 includes a cavity 110 recessed from interior surface 115 as well as a joining ring 116b that surrounds cavity 110. Cover glass 117 also includes interconnects 331 and routing 333. Cover plate 108 is now formed and is ready for alignment with a device substrate as described above with respect to FIG. 10.

Figure 17A:
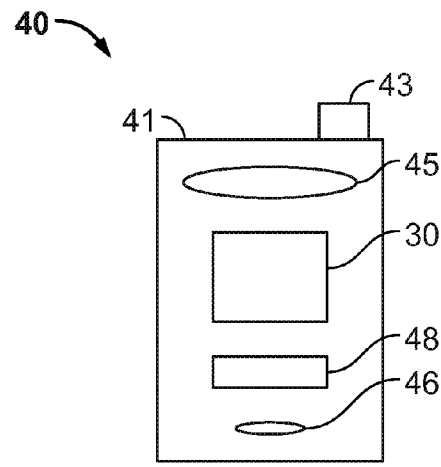
FIGS. 17A and 17B show examples of system block diagrams illustrating a display device that includes a plurality of interferometric modulators.
Figure 17B:
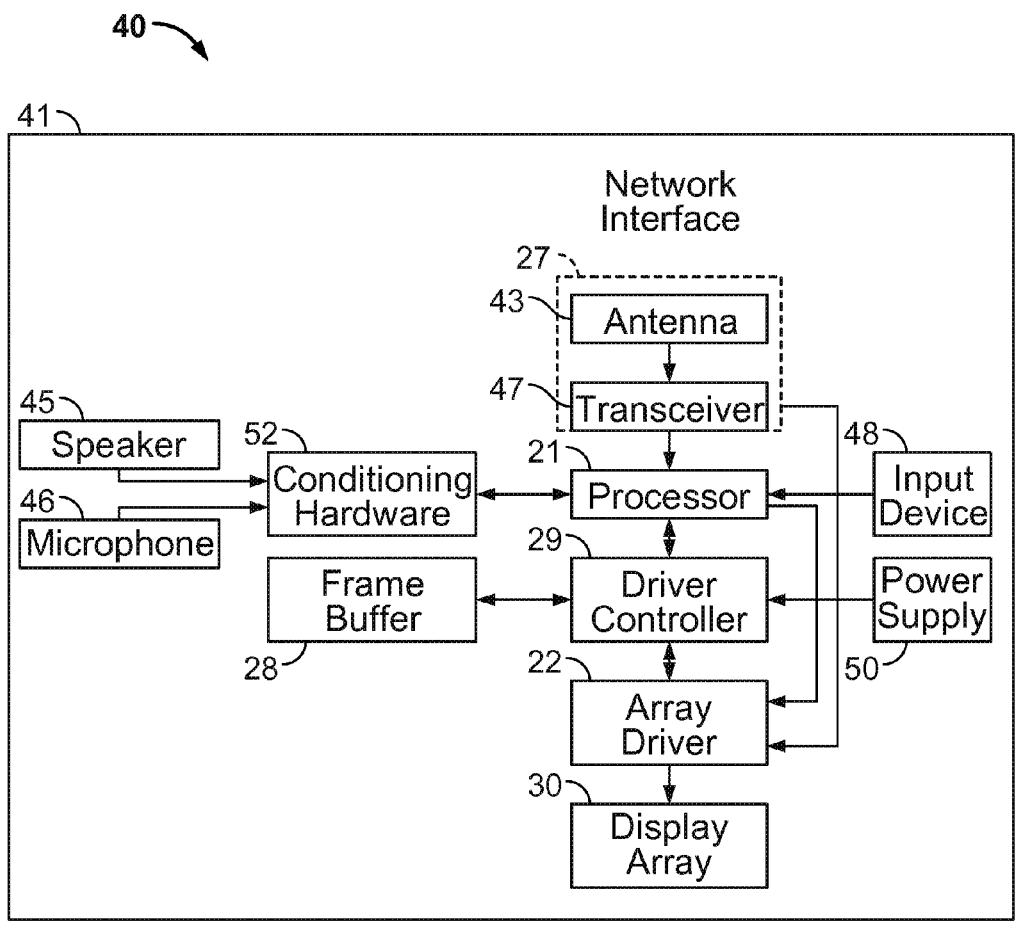

FIGS. 17A and 17B show examples of system block diagrams illustrating a display device 40 that includes a plurality of interferometric modulators. The display device 40 can be, for example, a smart phone, a cellular or mobile telephone. However, the same components of the display device 40 or slight variations thereof are also illustrative of various types of display devices such as televisions, tablets, e-readers, hand-held devices and portable media players.

The display device 40 includes a housing 41, a display 30, an antenna 43, a speaker 45, an input device 48 and a microphone 46. The display 30 can be incapsulated in with a cover glass using the techniques described above for batch-level encapsulation of MEMS devices. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an interferometric modulator display, as described herein.

The components of the display device 40 are schematically illustrated in FIG. 17B. The display device 40 includes a housing 41 and can include additional components at least partially enclosed therein. For example, the display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22, and the display array 30 are appropriate for any of the types of displays described herein. For example, the driver controller 29 can be a conventional display controller or a bi-stable display controller (such as an IMOD controller). Additionally, the array driver 22 can be a conventional driver or a bi-stable display driver (such as an IMOD display driver). Moreover, the display array 30 can be a conventional display array or a bi-stable display array (such as a display including an array of IMODs). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photo-voltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The steps of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blue-ray disc where disks usually reproduce data magnetically, while discs reproduce data optically with lasers. Combinations of the above also may be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. The word "exemplary" is used exclusively herein to mean "serving as an example, instance, or illustration." Any implementation described herein as "exemplary" is not necessarily to be construed as preferred or advantageous over other possibilities or implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of an IMOD as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multi-tasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

The invention claimed is:

1. An apparatus comprising:
a cover glass including one or more spin-on glass layers and having first and second opposing sides, the cover glass further including
a cavity,
a joining ring surrounding the cavity,
one or more routing lines on the first side, and
one or more metal posts extending through the one or more spin-on-glass layers to electrically connect the one or more routing lines on the first side to the second side.

2. The apparatus of claim 1, wherein the cover glass is between about 30 and 150 microns thick.

3. The apparatus of claim 1, wherein the joining ring is between about 100 and 500 microns wide.

4. The apparatus of claim 1, wherein the one or more routing lines conformally extend along at least a portion of the cavity.

5. The apparatus of claim 1, wherein the one or more routing lines and joining ring include a nickel-based material.

6. The apparatus of claim 1, wherein the one or more posts are cylindrical and have a diameter of between 30 microns and 100 microns.

7. The apparatus of claim 1 further comprising:
a device substrate including one or more devices disposed on a surface of the device substrate, wherein the cover glass is joined to the surface of the device substrate.

8. The apparatus of claim 7, wherein the one or more devices is in electrical communication with the one or more posts.

9. The apparatus of claim 7, further comprising a seal between the cover glass and the device substrate, wherein the seal includes the joining ring.

10. The apparatus of claim 9, wherein a device is sealed within an area defined at least in part by the cover glass, the device substrate and the seal.

11. The apparatus of claim 9, wherein the seal is between about 100 and 500 microns wide.

12. The apparatus of claim 1, further comprising:
a display;
a processor that is configured to communicate with the display, the processor being configured to process image data; and
a memory device that is configured to communicate with the processor.

13. The apparatus of claim 12, further comprising:
a driver circuit configured to send at least one signal to the display; and
a controller configured to send at least a portion of the image data to the driver circuit.

14. The apparatus of claim 12, further comprising:
an image source module configured to send the image data to the processor.

15. The apparatus of claim 12, wherein the image source module includes at least one of a receiver, transceiver, and transmitter.

16. The apparatus of claim 12, further comprising:
an input device configured to receive input data and to communicate the input data to the processor.

17. The apparatus of claim 1, wherein the metal posts are plated metal posts.

* * * * *